United States Patent
Mao et al.

(10) Patent No.: US 12,412,863 B2
(45) Date of Patent: Sep. 9, 2025

(54) DIE ATTACHED LEVELING CONTROL BY METAL STOPPER BUMPS

(71) Applicant: Taiwan Semiconductor Manufacturing Company, Ltd., Hsinchu (TW)

(72) Inventors: Wei-Jhih Mao, Taipei (TW); Kuei-Sung Chang, Kaohsiung (TW); Shang-Ying Tsai, Pingzhen (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/422,220

(22) Filed: Jan. 25, 2024

(65) Prior Publication Data
US 2024/0162183 A1     May 16, 2024

Related U.S. Application Data

(63) Continuation of application No. 17/184,924, filed on Feb. 25, 2021, now Pat. No. 11,923,331.

(51) Int. Cl.
*H01L 23/00*     (2006.01)
*H01L 21/48*     (2006.01)
(Continued)

(52) U.S. Cl.
CPC .......... *H01L 24/32* (2013.01); *H01L 21/4803* (2013.01); *H01L 21/4853* (2013.01);
(Continued)

(58) Field of Classification Search
None
See application file for complete search history.

(56) References Cited

U.S. PATENT DOCUMENTS

| | | | |
|---|---|---|---|
| 5,881,944 A | 3/1999 | Edwards et al. | |
| 6,294,408 B1 * | 9/2001 | Edwards | H01L 23/42 438/118 |

(Continued)

FOREIGN PATENT DOCUMENTS

| | | | |
|---|---|---|---|
| CN | 105552065 A | | 5/2016 |
| CN | 109936806 A | * | 6/2019 |

(Continued)

OTHER PUBLICATIONS

Huang et al. "Solder Bumping Via Paste Reflow for Area Array Packages" Proceedings of the IEEE/CPMT International Electronics Manufacturing Technology (IEMT) Symposium, published Feb. 2002.

(Continued)

*Primary Examiner* — Telly D Green
(74) *Attorney, Agent, or Firm* — Eschweiler & Potashnik, LLC

(57) ABSTRACT

In some embodiments, the present disclosure relates to an integrated chip including a substrate and a first die disposed over the substrate. A first plurality of die stopper bumps are disposed along a backside of the first die. The first plurality of die stopper bumps directly contact the backside of the first die, and the first plurality of die stopper bumps are arranged as a plurality of groups of die stopper bumps. A plurality of adhesive structures are also present. Each of the plurality of adhesive structures surrounds a corresponding group of the plurality of groups of die stopper bumps.

20 Claims, 32 Drawing Sheets

(51) Int. Cl.
*H01L 23/10* (2006.01)
*H01L 23/498* (2006.01)
*H01L 25/00* (2006.01)
*H01L 25/065* (2023.01)

(52) U.S. Cl.
CPC ........ *H01L 23/10* (2013.01); *H01L 23/49838* (2013.01); *H01L 24/14* (2013.01); *H01L 24/16* (2013.01); *H01L 24/17* (2013.01); *H01L 24/33* (2013.01); *H01L 24/48* (2013.01); *H01L 24/73* (2013.01); *H01L 24/81* (2013.01); *H01L 24/83* (2013.01); *H01L 24/92* (2013.01); *H01L 25/0657* (2013.01); *H01L 25/50* (2013.01); H01L 24/05 (2013.01); H01L 2224/05554 (2013.01); H01L 2224/1403 (2013.01); H01L 2224/1601 (2013.01); H01L 2224/16014 (2013.01); H01L 2224/16145 (2013.01); H01L 2224/16227 (2013.01); H01L 2224/1703 (2013.01); H01L 2224/17106 (2013.01); H01L 2224/17107 (2013.01); H01L 2224/26155 (2013.01); H01L 2224/32145 (2013.01); H01L 2224/32227 (2013.01); H01L 2224/3303 (2013.01); H01L 2224/33181 (2013.01); H01L 2224/48105 (2013.01); H01L 2224/48145 (2013.01); H01L 2224/48227 (2013.01); H01L 2224/73104 (2013.01); H01L 2224/73207 (2013.01); H01L 2224/73257 (2013.01); H01L 2224/81191 (2013.01); H01L 2224/81192 (2013.01); H01L 2224/819 (2013.01); H01L 2224/83191 (2013.01); H01L 2224/83192 (2013.01); H01L 2224/9211 (2013.01); H01L 2224/92247 (2013.01); H01L 2225/0651 (2013.01); H01L 2225/06513 (2013.01); H01L 2225/06517 (2013.01); H01L 2225/06568 (2013.01); H01L 2225/06582 (2013.01)

(56) References Cited

U.S. PATENT DOCUMENTS

| | | |
|---|---|---|
| 6,410,981 B2 | 6/2002 | Tao |
| 7,253,515 B2 | 8/2007 | Horie et al. |
| 7,521,810 B2 | 4/2009 | Kang et al. |
| 7,531,893 B2 | 5/2009 | Koduri |
| 7,830,020 B2 | 11/2010 | Dahilig et al. |
| 7,871,865 B2 | 1/2011 | Sengupta et al. |
| 7,928,562 B2* | 4/2011 | Arvelo ................ H01L 23/3675 257/725 |
| 8,550,327 B2 | 10/2013 | Deppisch et al. |
| 8,940,584 B2 | 1/2015 | Kim et al. |
| 9,196,575 B1 | 11/2015 | Lee et al. |
| 9,299,634 B2* | 3/2016 | Khan ..................... H01L 24/16 |
| 9,391,043 B2 | 7/2016 | Paek et al. |
| 9,543,242 B1 | 1/2017 | Kelly et al. |
| 9,607,863 B1 | 3/2017 | Lee |
| 9,721,872 B1 | 8/2017 | Nicholls et al. |
| 9,741,695 B2 | 8/2017 | Graf et al. |
| 9,870,967 B2 | 1/2018 | Bolognia et al. |
| 10,008,432 B2 | 6/2018 | Ihara et al. |
| 11,276,628 B2 | 3/2022 | Somma |
| 2004/0262774 A1 | 12/2004 | Kang et al. |
| 2012/0139125 A1 | 6/2012 | Kang et al. |
| 2014/0239477 A1 | 8/2014 | Kim et al. |
| 2017/0047266 A1 | 2/2017 | Ihara et al. |
| 2017/0200698 A1 | 7/2017 | Graf et al. |
| 2020/0350227 A1 | 11/2020 | Gogineni et al. |
| 2021/0125897 A1* | 4/2021 | Valavala ................ H10N 19/00 |

FOREIGN PATENT DOCUMENTS

| | | |
|---|---|---|
| CN | 110246812 A | 9/2019 |
| TW | 201633500 A | 9/2016 |

OTHER PUBLICATIONS

Son Jihye Eom Yong-Sung. "HV-SoP Technology for Maskless Fine-Pitch Bumping Process" Electronics and Telecommunications Research Institute (ETRI) Journal, published in 2015.

Media ATN. "Flip Chip Bump Technology: Au Stud" Published in 2019.

Advotech Company Inc. "Package Assembly" The date of publication is unknown. Retrieved online on Jan. 8, 2021 from https://www.advotech.com/package-assembly.html.

ASM. "Basic Die Bonding Process & Quality" Published in 2020.

Xiong et al. "Experimental investigation on the height deviation of bumps printed by solder jet technology" Journal of Materials Processing Technology 243 (2017) 291-298, published on Dec. 31, 2016.

Ren et al. "Experimental Parametric Study on the Bumping and Coining of Gold Studs for Flip Chip Bonding" IEEE 2016 China Semiconductor Technology International Conference (CSTIC), published on May 5, 2016.

Liang et al. "Geometrical Effect of Bump Resistance for Flip-Chip Solder Joints: Finite-Element Modeling and Experimental Results" Journal of Electronic Materials, vol. 35, No. 8, 2006, published on Apr. 4, 2006.

Min et al. "Influence ofBump Geometry, Adhesives and Pad Finishings on the Joint Resistance ofAu Bump and A/NCA Flip Chip Interconnection" IEEE 2005 7th Electronic Packaging Technology Conference, published on Apr. 10, 2006.

Lee, Ning-Cheng. "SEM of cross-section of CSP solder bump manufactured with 63Sn/37Pb solder paste via print-detachreflow process." The date of publication is unknown. Retrieved online on Jul. 8, 2021 from https://www.researchgate.net/figure/SEM-of-cross-section-of-CSP-solder-bump-manufactured-with-63Sn-37Pb-solder-paste-via_fig3_3967598.

U.S. Appl. No. 17/211,623, filed Mar. 24, 2021.

Non-Final Office Action dated Nov. 10, 2022 for U.S. Appl. No. 17/184,924.

Non-Final Office Action dated Feb. 27, 2023 for U.S. Appl. No. 17/184,924.

Final Office Action dated Aug. 2, 2023 for U.S. Appl. No. 17/184,924.

Notice of Allowance dated Nov. 1, 2023, for U.S. Appl. No. 17/184,924.

Non-Final Office Action dated Sep. 25, 2024, for U.S. Appl. No. 18/366,179.

Notice of Allowance dated Feb. 12, 2025 for U.S. Appl. No. 18/366,179.

\* cited by examiner

DIE ATTACHED LEVELING CONTROL BY METAL STOPPER BUMPS

REFERENCE TO RELATED APPLICATION

This Application is a Continuation of U.S. application Ser. No. 17/184,924, filed on Feb. 25, 2021, the contents of which are hereby incorporated by reference in their entirety.

BACKGROUND

Many modern-day integrated chips (ICs) include a semiconductor die that is attached to a substrate or a package, such as a printed circuit board. Thus, printed circuit board can include a mixture of different ICs that are electrically coupled to one another to achieve a higher-level function. For example, a printed circuit board for a mobile phone can include microprocessor ICs to process digital data, imaging ICs to enable camera type functions, analog ICs to regulate power or perform other functions on the mobile phone, and/or micro-electrical-mechanical system (MEMS) ICs to act as an accelerometer and/or global positioning system (GPS) unit, for example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
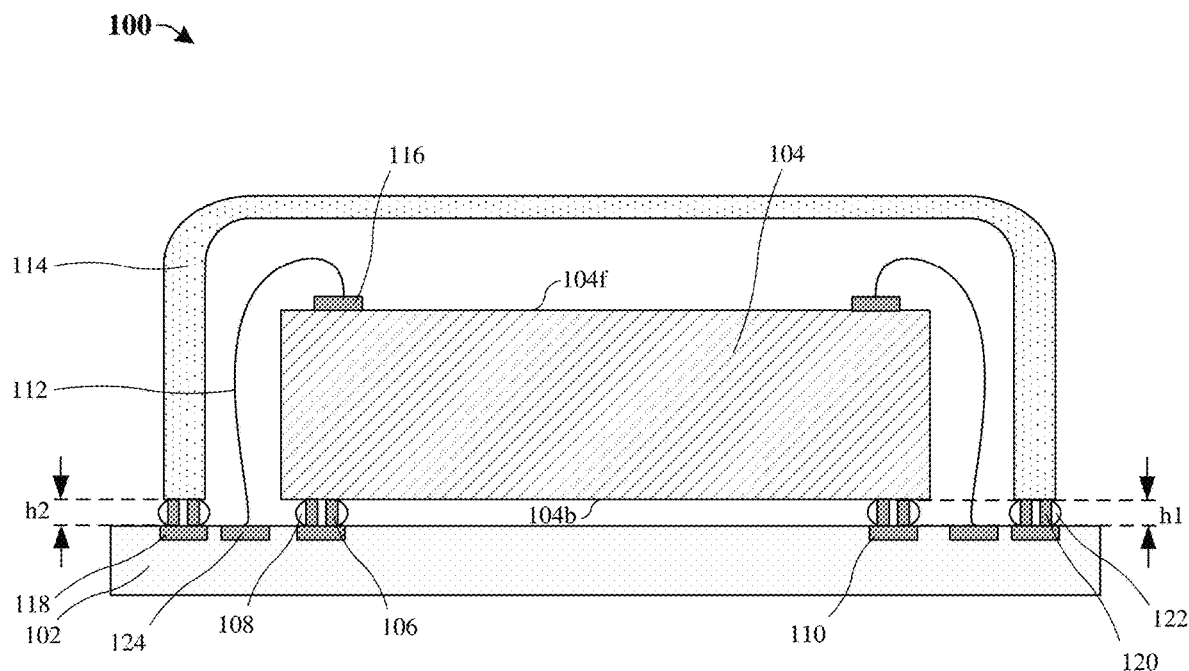
FIG. 1 illustrates a cross-sectional view 100 of some embodiments of an IC comprising a stopper bump structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An IC package may adhere a semiconductor die to a substrate by an adhesive structure. Many factors may cause the semiconductor die to tilt at an angle of other than zero degrees with respect to a laterally-extending surface of the substrate. Some of these factors may include a variability in the viscosity of the adhesive structure, an inability to manipulate the semiconductor die after adhesive curing, a variability in the amount of adhesive dispensed, a variability in adhesive shrinkage after curing, a variability in the geometry of the adhesive structure, and/or a variability in contact angle between the adhesive structure and the semiconductor die. Each of these factors may work individually and/or in combination to contribute to die tilt.

For a semiconductor die in an IC package, die tilt may cause a negative impact to device performance. A semiconductor die may comprise an accelerometer, and die tilt may cause the accelerometer to be in an unbalanced position. Thus, because some devices when manufactured may have accelerometers in an unbalanced position, the manufacturing process may employ significant calibration of the devices after packaging, leading to additional time and manufacturing costs. In addition, for optical devices, excessive die tilt can cause the light path for these optical devices to be offset from the optimal angle (e.g., offset from normal), which may lead to worsened device performance. A semiconductor die may be wire bonded to a substrate or a package to improve performance, but die tilt may still lead to additional time and manufacturing costs, as well as a decrease in device performance.

In the present disclosure, an IC package is presented which allows for die attachment control. Stopper bumps in addition to an adhesive structure are arranged between a semiconductor die and a substrate, between a semiconductor die and a package, and/or between a semiconductor die and an additional semiconductor die to constrain the gap between the semiconductor die and the substrate. The addition of stopper bumps allows for stacked devices to have better gap control and better leveling. For example, an optical device may need to have a lens aligned with an optical axis, and hence the addition of stopper bumps allows for a more level optical device with a lens properly aligned with the optical axis. In an additional example, motion sensors may need to control zero-gravitation offset, which is caused by an accelerometer being misaligned. The addition of stopper bumps allows for the accelerometer in the motion sensor to be properly aligned after the packaging process, and additional time and materials are not required to realign the semiconductor die, thus controlling zero-gravitation offset.

FIG. 1 illustrates a cross-sectional view 100 of some embodiments of an IC comprising a stopper bump structure. The IC comprises a substrate 102 underlying a semiconductor die 104. The substrate 102 may mechanically support and electrically connect electrical components such as the semiconductor die 104 and other electrical components that are not shown. In some embodiments, a frontside surface 104f of the semiconductor die 104 is above a backside surface 104b of the semiconductor die 104. The substrate 102 may be or otherwise comprise, for example, an IC die, a printed circuit board (PCB), or some other suitable type of substrate. The semiconductor die 104 may be or otherwise comprise, for example, a MEMS structure, a semiconductor substrate, or some other suitable integrated chip. In some embodiments, the front side surface 104f of the semiconductor die 104 generally corresponds to a side of the die on which active devices are disposed, while the back side surface 104b corresponds to a side of the die without active devices thereon, however in other embodiments this naming convention can be flipped. The front side surface 104f and/or back side surface 104b can also be referred to as a first side and second side (respectively, or vice versa).

A first plurality of metal pads 110 are disposed along the top surface of the substrate 102. A plurality of die stopper bumps 106 separate the substrate 102 from the semiconductor die 104. In some embodiments, the plurality of die stopper bumps 106 directly contacts the semiconductor die 104 and the first plurality of metal pads 110. The plurality of die stopper bumps 106 are configured to control an angle of operation of the semiconductor die 104. A first plurality of adhesive structures 108 may surround each of the plurality of die stopper bumps 106 and provides adhesion between the semiconductor die 104 and the substrate 102. A second plurality of metal pads 116 are disposed along a frontside surface 104f of the semiconductor die 104.

In some embodiments, a housing structure 114 overlies and provides protection to the semiconductor die 104. The housing structure 114 may surround outer sidewalls of the semiconductor die 104. In some embodiments, both an inner surface of the housing structure 114 and an outer surface of the housing structure 114 have a U-shaped cross-sectional profile. The inner surface and the outer surface of the housing structure 114 may be connected by a bottom surface of the housing structure 114. The bottom surface may be vertically between the top surface of the substrate 102 and a lateral portion of the inner surface of the housing structure 114.

A third plurality of metal pads 118 and a fourth plurality of metal pads 124 are disposed along a top surface of the substrate 102. In some embodiments, the fourth plurality of metal pads 124 are laterally between the first plurality of metal pads 110 and the third plurality of metal pads 118. A plurality of housing stopper bumps 120 separate the substrate 102 from the housing structure 114. In some embodiments, the plurality of housing stopper bumps 120 directly contacts the housing structure 114 and the third plurality of metal pads 118. The plurality of housing stopper bumps 120 are configured to control an angle of operation of the housing structure 114. A second plurality of adhesive structures 122 may surround each of the plurality of housing stopper bumps 120 and provides adhesion between the housing structure 114 and the substrate 102. In some embodiments, the first plurality of metal pads 110, the second plurality of metal pads 116, the third plurality of metal pads 118, and/or the fourth plurality of metal pads 124 are conductive and serve as a live electrical connection. In some embodiments, the first plurality of metal pads 110, the second plurality of metal pads 116, the third plurality of metal pads 118, and/or the fourth plurality of metal pads 124 are floating without an electrical connection. A metal wire 112 bonds the fourth plurality of metal pads 124 to the second plurality of metal pads 116. In some embodiments, the metal wire 112 may provide stability to the semiconductor die 104. In some embodiments, the metal wire 112 may provide an electrical connection between the semiconductor die 104 and the substrate 102.

The plurality of die stopper bumps 106 and the plurality of housing stopper bumps 120 may be or otherwise comprise, for example, gold, copper, iron, nickel, or some other suitable material(s). The first plurality of metal pads 110, the second plurality of metal pads 116, and the third plurality of metal pads 118 may be or otherwise comprise, for example, copper, iron, nickel, gold, silver, or some other suitable metal(s). The metal wires 112 may be or otherwise comprise, for example, aluminum, copper, silver, gold, or some other suitable metal(s). The housing structure 114 may be or otherwise, for example, comprise molded plastic, ceramic, or some other suitable packaging material(s). The first plurality of adhesive structures 108 and the second plurality of adhesive structures 122 may be or otherwise comprise, for example, epoxy glue or some other suitable adhesive(s). The plurality of die stopper bumps 106 have first predetermined heights that set the tilt of the semiconductor die 104, and the plurality of housing stopper bumps 120 have second predetermined heights that set the tilt of the housing structure 114. In some embodiments, each of the plurality of die stopper bumps 106 share a first height h1, wherein h1 can range from 15 um to 400 um, and each of the plurality of housing stopper bumps 120 share a second height h2, wherein h2 can range from 15 um to 400 um. In some embodiments, h1 is equal to h2. In some embodiments, h1 is less than or greater than h2.

Bonding a semiconductor die to a substrate may cause the semiconductor die to tilt, leading to an impact on device performance and increase in manufacturing cost and time. The IC illustrated in FIG. 1 allows for tilt control of both the semiconductor die 104 and the housing structure 114, while still adhering the semiconductor die 104 and the housing structure 114 to the substrate 102. The plurality of die stopper bumps 106 constrain a gap between the semiconductor die 104 and the substrate 102, allowing for the semiconductor die 104 to have a controlled level of tilt while still adhering to the substrate 102. The plurality of housing stopper bumps 120 constrain a gap between the housing structure 114 and the substrate 102, allowing for the housing structure 114 to have a controlled level of tilt while still allowing for the housing structure 114 to be adhered to the substrate 102. An optical device may utilize precise package leveling control to ensure a proper optical path to the optical device. Controlled tilt of the semiconductor die 104 and the housing structure 114 may have a positive impact on device performance while decreasing manufacturing cost and manufacturing time.

Figure 2:
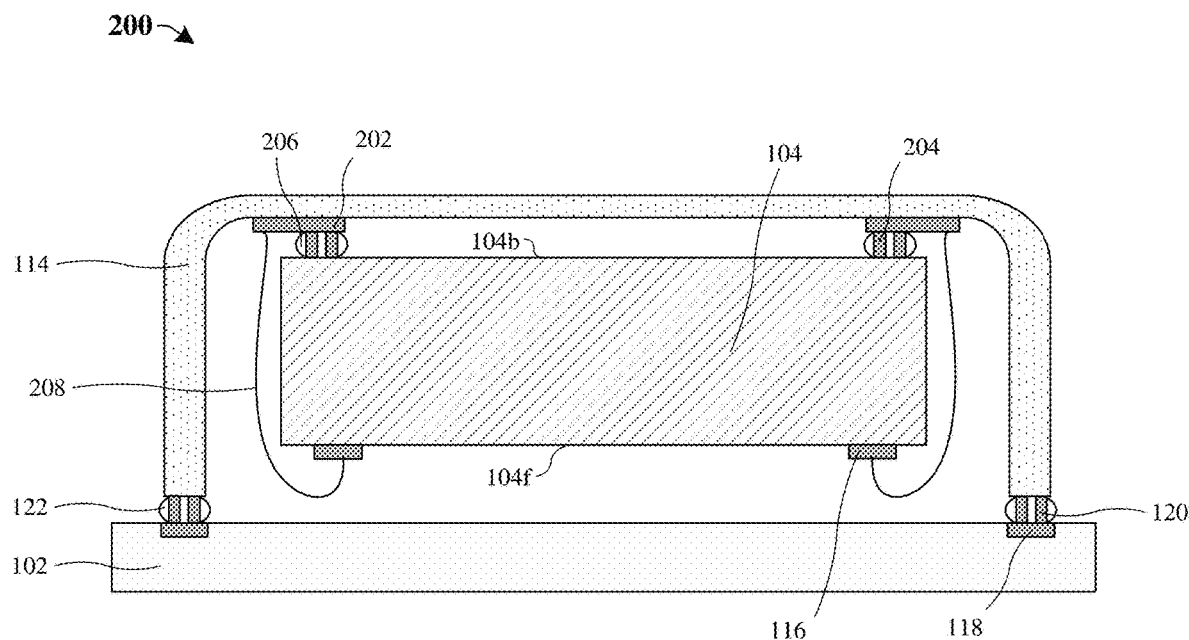
FIG. 2 illustrates a cross-sectional view of some embodiments of an IC comprising a stopper bump structure separating a housing structure from a semiconductor die.

FIG. 2 illustrates a cross-sectional view 200 of some embodiments of an IC comprising a stopper bump structure separating a housing structure from a semiconductor die. The IC comprises a substrate 102 disposed below a semiconductor die 104. A housing structure 114 is disposed over the substrate 102. A third plurality of metal pads 118 is disposed along a top surface of the substrate 102. In some embodiments, a bottom surface of the third plurality of metal pads 118 is below a top surface of the substrate 102. A bottom surface of the housing structure 114 directly overlies the third plurality of metal pads 118. A plurality of housing stopper bumps 120 vertically separates the housing structure 114 from the third plurality of metal pads 118. A second plurality of adhesive structures 122 surrounds each of the plurality of housing stopper bumps 120, such that each of the second plurality of adhesive structures 122 is a single continuous body. In some embodiments, a frontside surface 104f of the semiconductor die 104 is below a backside surface 104b of the semiconductor die 104.

A plurality of metal housing pads 202 is disposed along the lateral portion of the inner surface of the housing structure 114. A plurality of die stopper bumps 204 separates the housing structure 114 from the semiconductor die 104. The plurality of die stopper bumps 204 vertically separates the semiconductor die 104 from a bottom surface of the plurality of metal housing pads 202. The plurality of die stopper bumps 204 are configured to control an angle of operation of the semiconductor die 104. A plurality of housing adhesive structures 206 surround each of the plurality of die stopper bumps 204 and provide adhesion between the semiconductor die 104 and the plurality of metal housing pads 202. In some embodiments, metal wires 208 connect a bottom surface of the plurality of metal housing pads 202 to a bottom surface of the second plurality of metal pads 116.

The metal housing pads 202 may be or otherwise comprise, for example, copper, iron, nickel, gold, silver, or some other suitable metal(s). The plurality of die stopper bumps 204 may be or otherwise comprise, for example, gold, copper, iron, nickel, or some other suitable material(s). The plurality of housing adhesive structures 206 may be or otherwise comprise, for example, epoxy glue or some other suitable adhesive(s). The metal wires 208 may be or otherwise comprise, for example, aluminum, copper, silver, gold, or some other suitable metal(s).

The IC illustrated in FIG. 2 allows for tilt control of both the semiconductor die 104 and the housing structure 114, while still adhering the semiconductor die 104 to the housing structure 114 and the housing structure 114 to the substrate 102. The plurality of die stopper bumps 204 constrain a gap between the semiconductor die 104 and the housing structure 114, allowing for the semiconductor die 104 to have a controlled level of tilt while still adhering to the housing structure 114. Controlled tilt of the semiconductor die 104 through the use of the plurality of die stopper bumps 204 may have a positive impact on device performance while decreasing manufacturing cost and manufacturing time.

Figure 3:
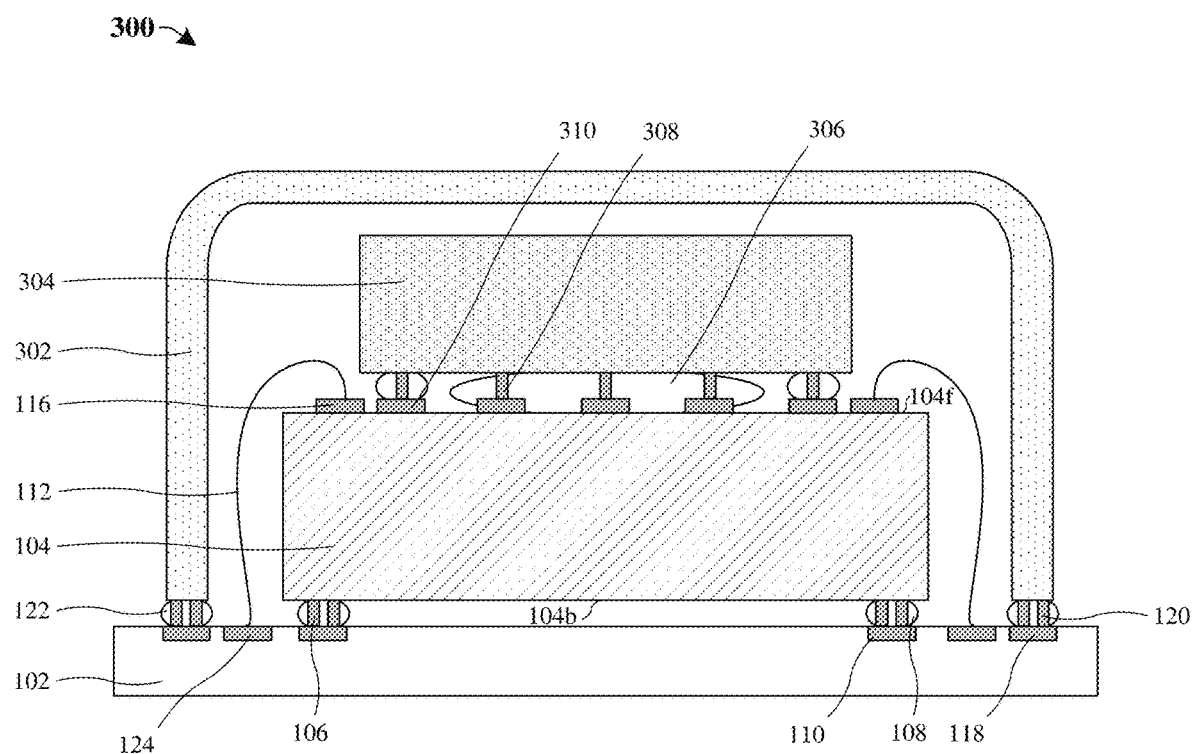
FIG. 3 illustrates a cross-sectional view of some embodiments of an IC comprising a stopper bump structure separating stacked ICs.

FIG. 3 illustrates a cross-sectional view 300 of some embodiments of an IC comprising a stopper bump structure separating stacked ICs. A semiconductor die 104 is disposed above a substrate 102. A first plurality of metal pads 110 are disposed between the substrate 102 and the semiconductor die 104. In some embodiments, a frontside surface 104f of the semiconductor die 104 is above a backside surface 104b of the semiconductor die 104.

A plurality of die stopper bumps 106 separates the substrate 102 from the semiconductor die 104. In some embodiments, a top surface of the plurality of die stopper bumps 106 contacts the backside surface 104b of the semiconductor die 104, and a bottom surface of the plurality of die stopper bumps 106 contacts a top surface of the first plurality of metal pads 110. A first plurality of adhesive structures 108 is disposed between the first plurality of metal pads 110 and the semiconductor die 104. In some embodiments, each of the plurality of die stopper bumps 106 is laterally surrounded by an adhesive structure of the plurality of adhesive structures 108.

A plurality of metal die pads 310 overlies the semiconductor die 104. A stacked semiconductor die 304 overlies the plurality of metal die pads 310. In some embodiments, outer sidewalls of the stacked semiconductor die 304 may be laterally offset from outer sidewalls of the semiconductor die 104. A plurality of overlying die stopper bumps 308 separate the stacked semiconductor die 304 from the semiconductor die 104. In some embodiments, the plurality of overlying die stopper bumps 308 directly contact the stacked semiconductor die 304 and the plurality of metal die pads 310. The plurality of overlying die stopper bumps 308 is configured to control an angle of operation of the stacked semiconductor die 304.

A plurality of overlying adhesive structures 306 may surround each of the plurality of overlying die stopper bumps 308. In some embodiments, each of the plurality of overlying die stopper bumps 308 is laterally surrounded by an adhesive structure of the plurality of overlying adhesive structures 306. In some embodiments, one or more overlying adhesive structure of the plurality of overlying adhesive structures 306 may continuously extend to surround more than one die stopper bump of the plurality of overlying die stopper bumps 308. In some embodiments, each of the plurality of overlying adhesive structures 306 continuously extends to surround no more than one overlying die stopper bump of the plurality of overlying die stopper bumps 308.

In some embodiments, a housing structure 302 overlies and provides protection to the semiconductor die 104 and the stacked semiconductor die 304. The housing structure 302 may surround outer sidewalls of the semiconductor die 104 and outer sidewalls of the stacked semiconductor die 304. In some embodiments, both an inner surface of the housing structure 302 and an outer surface of the housing structure 302 have a U-shaped cross-sectional profile. The inner surface and the outer surface of the housing structure 302 may be connected by a bottom surface of the housing structure 302. The bottom surface may be vertically between the top surface of the substrate 102 and a lateral portion of the inner surface of the housing structure 302.

A third plurality of metal pads 118 and a fourth plurality of metal pads 124 are disposed along the top surface of the substrate 102. A plurality of housing stopper bumps 120 separates the substrate 102 from the bottom surface of a housing structure 302. In some embodiments, the plurality of housing stopper bumps 120 directly contacts the housing structure 302 and the third plurality of metal pads 118. The plurality of housing stopper bumps 120 are configured to control an angle of operation of the housing structure 302. A second plurality of adhesive structures 122 may surround each of the plurality of housing stopper bumps 120 and provides adhesion between the housing structure 302 and the substrate 102. A metal wire 112 couples the fourth plurality of metal pads 124 to the second plurality of metal pads 116.

The stacked semiconductor die 304 may be or otherwise comprise, for example, a MEMS structure, a semiconductor substrate, or some other suitable integrated chip. In some embodiments, the stacked semiconductor die 304 and the semiconductor die 104 may be structurally similar. In some embodiments, the stacked semiconductor die 304 and the semiconductor die 104 may be structurally different. The plurality of overlying die stopper bumps 308 may be or otherwise comprise, for example, gold, copper, iron, nickel, or some other suitable material(s). The plurality of metal die pads 310 may be or otherwise comprise, for example, copper, iron, nickel, gold, silver, or some other suitable metal(s). The housing structure 302 may be or otherwise, for example, comprise molded plastic, ceramic, or some other suitable packaging material(s). The plurality of overlying adhesive structures 306 may be or otherwise comprise, for example, epoxy glue or some other suitable adhesive(s).

The IC illustrated in FIG. 3 allows for tilt control of the semiconductor die 104, the housing structure 302 and the stacked semiconductor die 304 while still adhering the semiconductor die 104 and the housing structure 302 to the substrate 102, and a bottom surface of the stacked semiconductor die 304 to the frontside surface 104f of the semiconductor die 104. The plurality of die stopper bumps 106 constrain a gap between the semiconductor die 104 and the substrate 102. Further, the plurality of overlying die stopper bumps 308 constrain a gap between the semiconductor die 104 and the stacked semiconductor die 304. This decreases manufacturing cost and manufacturing time, and allows for three-dimensional integrated chips (3D-ICs) to have tilt control between semiconductor dies.

Figure 4:
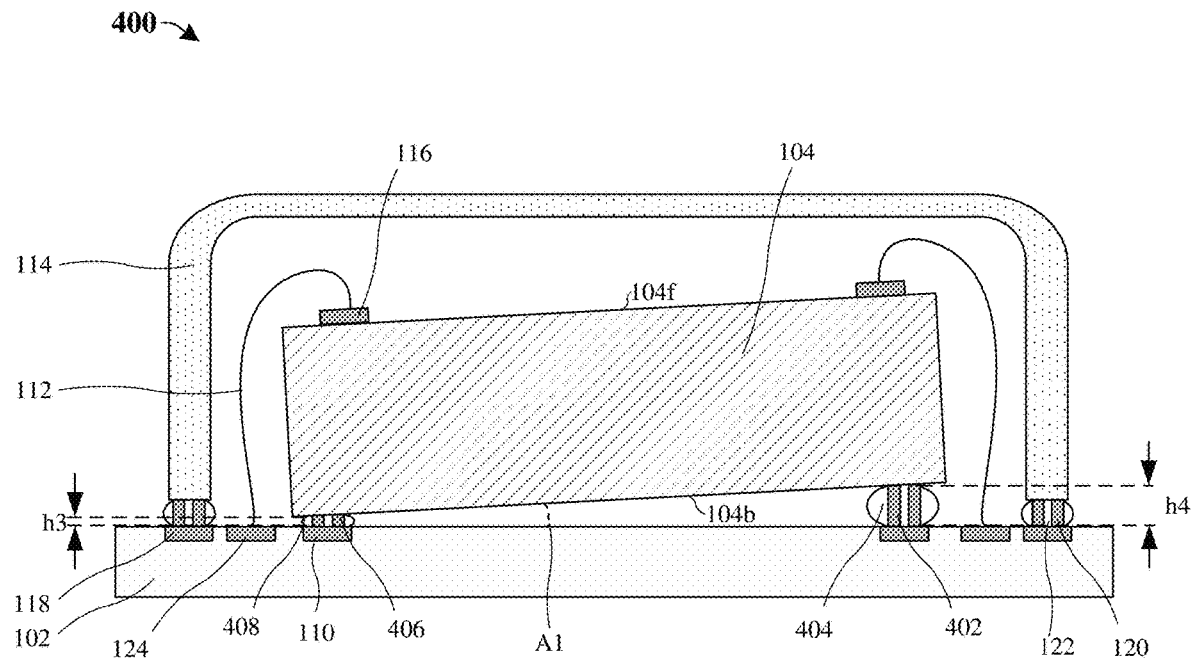
FIG. 4 illustrates a cross-sectional view of some embodiments of an IC comprising a stopper bump structure used to control an angle of a semiconductor die.

FIG. 4 illustrates a cross-sectional view 400 of some embodiments of an IC comprising a stopper bump structure used to control an angle of a semiconductor die. The IC comprises a substrate 102 underlying a semiconductor die 104. In some embodiments, a frontside surface of the semiconductor die 104 is above a backside surface 104b of the semiconductor die 104.

A first plurality of metal pads 110 are disposed along the top surface of the substrate 102, such that sidewalls of each of the plurality of metal pads 110 contacts inner sidewalls of the substrate 102. A first plurality of die stopper bumps 406 are disposed on a first end of the backside of the semiconductor die 104 and separate the substrate 102 from the semiconductor die 104. In some embodiments, the first plurality of die stopper bumps 406 directly contacts the semiconductor die 104 and the first plurality of metal pads 110. The first plurality of die stopper bumps 406 may have a height h3. A first plurality of die adhesive structures 408 may surround each of the first plurality of die stopper bumps 406 and provides adhesion between the semiconductor die 104 and the substrate 102.

A second plurality of die stopper bumps 402 are disposed on a second end of the backside 104b of the semiconductor die 104 opposite the first end, such that the first plurality of die stopper bumps 406 and the second plurality of die stopper bumps 402 are configured to keep a backside surface 104b of the semiconductor die 104 above a top surface of the first plurality of metal pads 110. The second plurality of die stopper bumps 402 separates the substrate 102 from the semiconductor die 104. In some embodiments, the second plurality of die stopper bumps 402 directly contacts the semiconductor die 104 and the first plurality of metal pads 110. The second plurality of die stopper bumps 402 may have a height h4. In some embodiments, h4 is larger than h3. A second plurality of die adhesive structures 404 may surround each of the second plurality of die stopper bumps 402 and provides adhesion between the semiconductor die 104 and the substrate 102. In some embodiments, the first plurality of die stopper bumps 406 and the second plurality of die stopper bumps 402 are configured to control a tilt angle A1 of the semiconductor die 104. In some embodiments, the tilt angle A1 of the semiconductor die 104 is greater than 0 degrees with respect to a top surface of the substrate 102.

A second plurality of metal pads 116 are disposed along a frontside surface 104f of the semiconductor die 104. In some embodiments, the second plurality of metal pads 116 directly overlie the first plurality of metal pads 110. In some embodiments, a housing structure 114 is disposed over the semiconductor die 104.

A third plurality of metal pads 118 and a fourth plurality of metal pads 124 are disposed along a top surface of the substrate 102. A plurality of housing stopper bumps 120 are disposed vertically between a bottom surface of the housing structure 114 and a top surface of the third plurality of metal pads. In some embodiments, each of the plurality of housing stopper bumps 120 may be at a different height to control an angle of the housing structure 114 to range from approximately 0 degrees to approximately 20 degrees with respect to a top surface of the substrate 102. A second plurality of adhesive structures 122 may surround each of the plurality of housing stopper bumps 120. A metal wire 112 mechanically connects the fourth plurality of metal pads 124 to the second plurality of metal pads 116. In some embodiments, the metal wire 112 may provide stability to the semiconductor die 104. In some embodiments, the metal wire 112 may provide an electrical connection between the semiconductor die 104 and the substrate 102.

The first plurality of die stopper bumps 402 and the second plurality of die stopper bumps 406 may be or otherwise comprise, for example, gold, copper, iron, nickel, or some other suitable material(s). The first plurality of die adhesive structures 408 and the second plurality of die adhesive structures 404 may be or otherwise comprise, for example, epoxy glue or some other suitable adhesive(s).

The IC illustrated in FIG. 4 allows for tilt control of the semiconductor die 104 to a desired angle of operation A1, while adhering the semiconductor die 104 to the substrate 102. The first plurality of die stopper bumps 406 and the second plurality of die stopper bumps 402 are at different heights h3 and h4, allowing for the semiconductor die 104 to have a controlled angle of tilt A1 while still adhering to the substrate 102. Controlled tilt of the semiconductor die 104 to a specific tilt angle A1 may have a positive impact on device performance in certain devices that may benefit from a tilted angle of operation.

Figure 5:
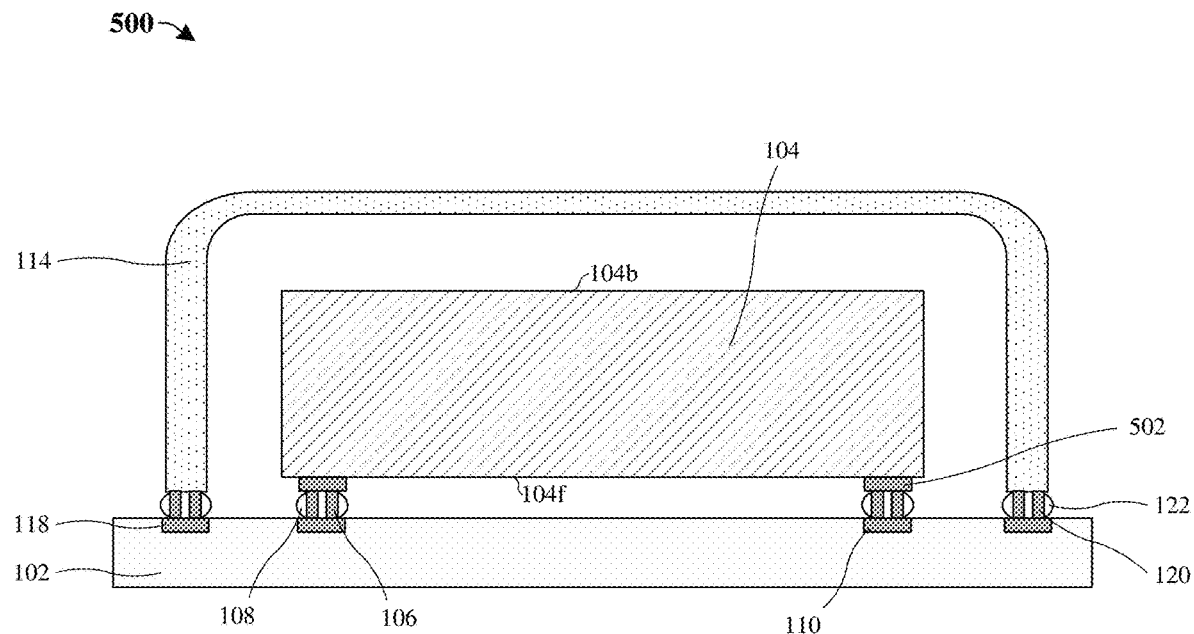
FIG. 5 illustrates a cross-sectional view of some embodiments of an IC comprising an electrically conductive stopper bump structure.

FIG. 5 illustrates a cross-sectional view 500 of some embodiments of an IC comprising an electrically conductive stopper bump structure. The IC comprises a substrate 102 underlying a semiconductor die 104. The substrate 102 may mechanically support and electrically connect electrical components such as the semiconductor die 104 and other electrical components that are not shown. In some embodiments, a frontside surface of the semiconductor die 104 is below a backside surface of the semiconductor die 104.

A plurality of die stopper bumps 106 vertically separate the substrate 102 from the semiconductor die 104. In some embodiments, the plurality of die stopper bumps 106 separates the semiconductor die 104 and a first plurality of metal pads 110 overlying the substrate 102. A first plurality of adhesive structures 108 may laterally surround each of the plurality of die stopper bumps 106. A plurality of metal die pads 502 is disposed along a frontside surface of the semiconductor die 104 and is configured to electrically couple the semiconductor die 104 to the substrate 102. In some embodiments, the plurality of die stopper bumps 106 are electrically conductive and act as vias electrically coupling the first plurality of metal pads 110 to the plurality of metal die pads 502. The plurality of metal die pads 502 may be or otherwise comprise, for example, copper, iron, nickel, gold, silver, or some other suitable metal(s).

In some embodiments, a housing structure 114 is disposed directly over the substrate 102. The housing structure 114 may surround the semiconductor die 104. A plurality of housing stopper bumps 120 separates the housing structure 114 from a third plurality of metal pads 118 overlying the substrate 102. A second plurality of adhesive structures 122 may laterally surround each of the plurality of housing stopper bumps 120.

The IC illustrated in FIG. 5 allows for tilt control of both the semiconductor die 104 and the housing structure 114, while further allowing for an electrical current to pass between the substrate 102 and the semiconductor die 104. The plurality of die stopper bumps 106 constrain a gap between the semiconductor die 104 and the substrate 102, allowing for the semiconductor die 104 to have a controlled level of tilt while still adhering to the substrate 102. Further, the plurality of metal die pads 502 may be electrically conductive, allowing for the semiconductor die 104 to be electrically coupled to the substrate 102 by the plurality of die stopper bumps 106. Controlled tilt of the semiconductor die 104 by means of electrically conductive vias may decrease manufacturing cost and manufacturing time, while allowing for further applications.

With reference to FIGS. 6A-6G, a series of cross-sectional and isometric views 600A-600G illustrate some embodiments of a die stopper bump structure. The die stopper bump structures may, for example, correspond to the die stopper bumps of FIG. 1.

Figure 6A:
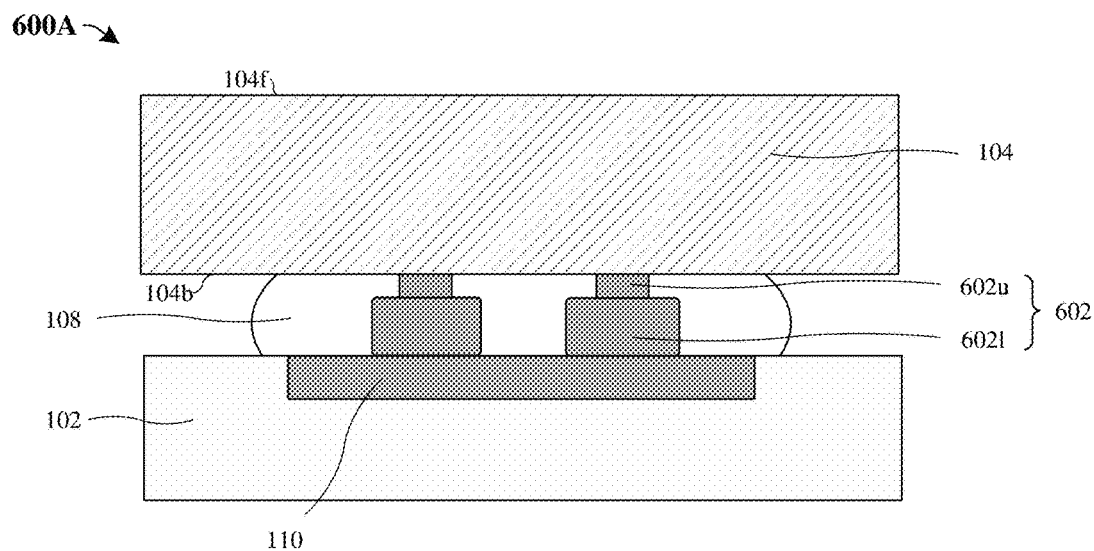
FIGS. 6A-6G illustrate a series of cross-sectional and isometric views of some embodiments of a die stopper bump structure.

FIG. 6A illustrates a cross-sectional view 600A of some embodiments of a die stopper bump structure. The die stopper bump structure comprises a plurality of stud bumps 602, each comprising an upper portion 602u and a lower portion 602l. The plurality of stud bumps 602 vertically separate a substrate 102 from a semiconductor die 104. A metal pad 110 overlies the substrate 102, and the plurality of stud bumps 602 are disposed on the metal pad 110. An adhesive structure 108 surrounds outer sidewalls of each of the plurality of stud bumps 602. In some embodiments, a bottom surface of the lower portion 602l of each stud bump 602 directly contacts the metal pad 110. In some embodiments, a top surface of the upper portion 602u of each stud bump 602 directly contacts the semiconductor die 104. In some embodiments, the plurality of stud bumps 602 may serve as an electrical interconnect between the semiconductor die 104 and the substrate 102. In some embodiments, the plurality of stud bumps 602 may separate the substrate 102 from a housing structure. In some embodiments, the plurality of stud bumps 602 may be or otherwise comprise, for example, copper, iron, nickel, gold, silver, or some other suitable metal(s).

Figure 6B:
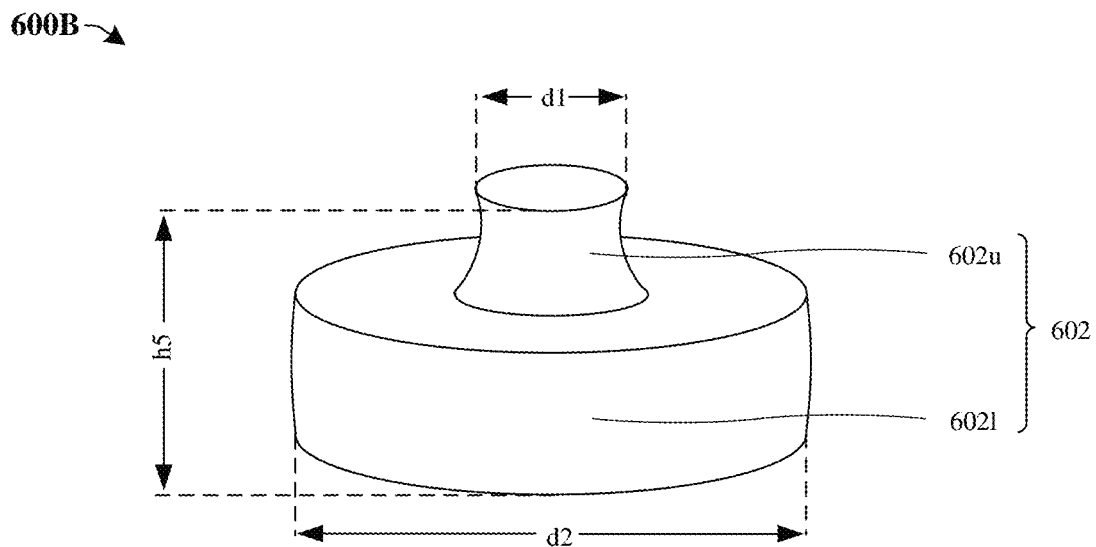

FIG. 6B illustrates an isometric view 600B of some embodiments of a stud bump. The stud bump may, for example, correspond to one of the plurality of stud bumps illustrated in FIG. 6A. The stud bump 602 comprises an upper portion 602u and a lower portion 602l. A height h5 of each stud bump 602 may range from 35 um to 60 um. In some embodiments, a height of the lower portion 602l of each stud bump 602 may equal a height of the upper portion 602u. The upper portion 602u of each stud bump 602 may have a diameter d1 ranging from 15 um to 35 um. The lower portion 602l of each stud bump 602 may have a diameter d2 ranging from 50 um to 90 um.

Figure 6C:
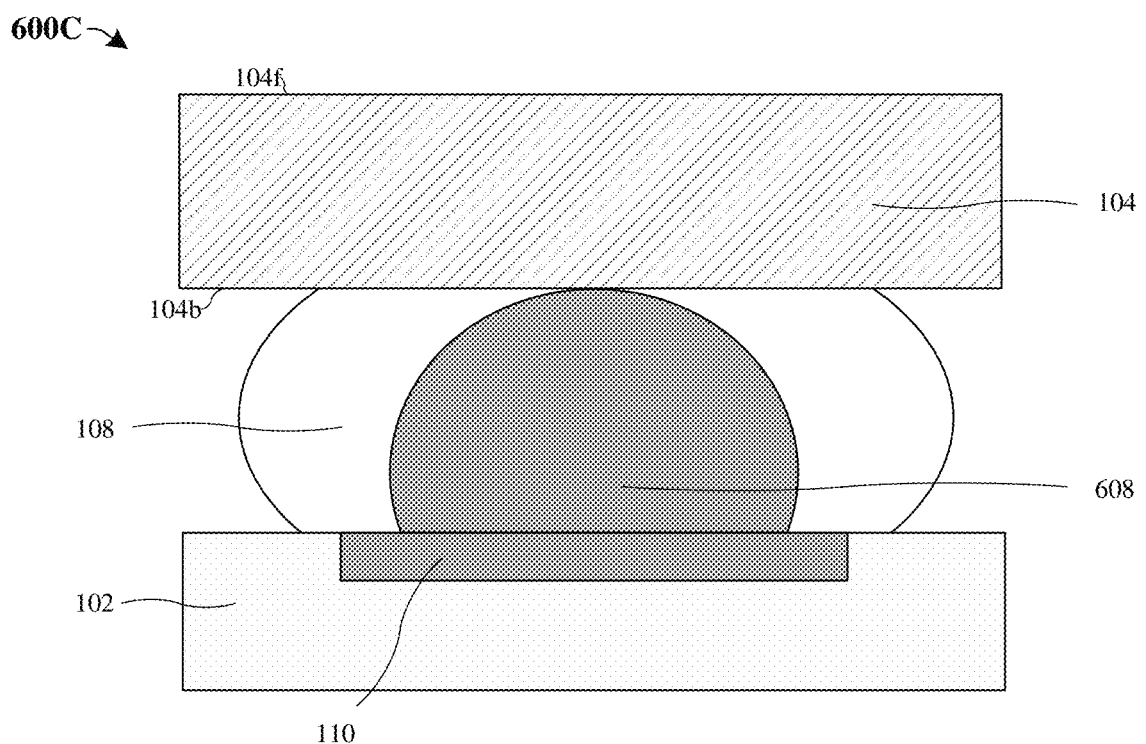

FIG. 6C illustrates a cross-sectional view 600C of some embodiments of a die stopper bump structure. The die stopper bump structure comprises a metal ball bump 608 that separates a substrate 102 from a semiconductor die 104. A metal pad 110 overlies the substrate, and the metal ball bump 608 overlies the metal pad 110. In some embodiments, the metal pad 110 may directly contact a bottom surface of the metal pad 110. A metal ball adhesive structure 108 surrounds outer sidewalls of the metal ball bump 608. In some embodiments, a height of the metal ball bump 608 may range from 250 um to 400 um. In some embodiments, the die stopper bump structure may comprise a plurality of metal ball bumps to achieve better stabilization of the semiconductor die 104. In some embodiments, the plurality of metal ball bumps 608 may separate the substrate 102 from a housing structure. In some embodiments, the plurality of metal ball bumps 608 may be or otherwise comprise, for example, tin, lead, copper, iron, nickel, gold, silver, some other suitable metal(s), or a combination of the foregoing.

Figure 6D:
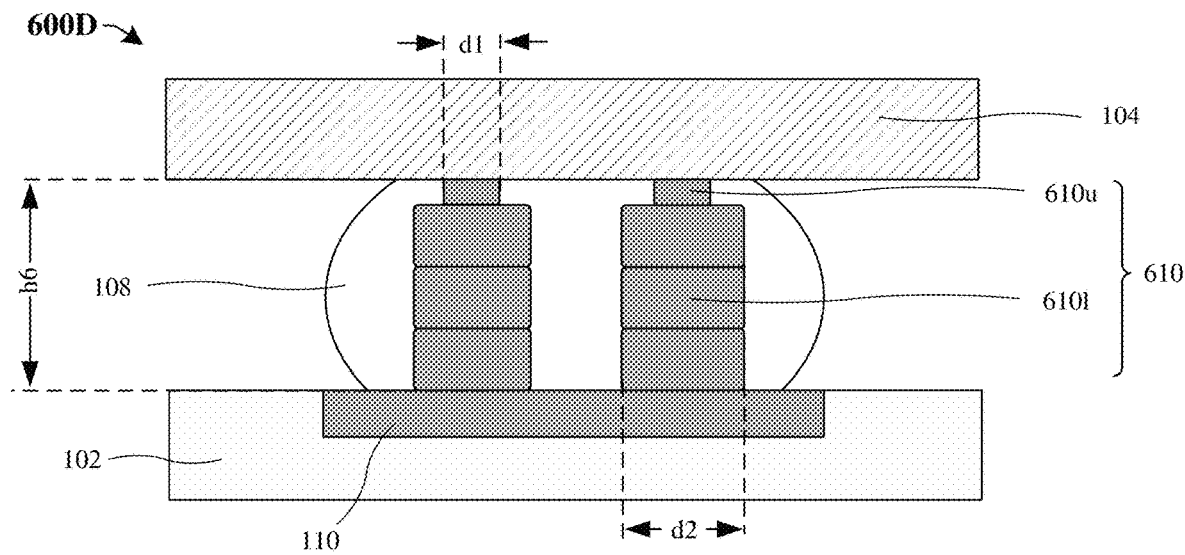

FIG. 6D illustrates a cross-sectional view 600D of some embodiments of a die stopper bump structure. The die stopper bump structure comprises a plurality of stud bumps 610, each comprising an upper portion 610u and a plurality of stacked lower portions 610l. The plurality of stud bumps 610 vertically separate a substrate 102 from a semiconductor die 104. A metal pad 110 overlies the substrate 102, and the plurality of stud bumps 610 are disposed on the metal pad 110. An adhesive structure 108 surrounds outer sidewalls of each of the plurality of stud bumps 610. In some embodiments, a bottom surface of the plurality of stacked lower portions 610l of each stud bump 610 directly contacts the metal pad 110. In some embodiments, a top surface of the upper portion 610u of each stud bump 610 directly contacts the semiconductor die 104. In some embodiments, the plurality of stacked lower portions 610l comprise at least three stacked portions. In some embodiments, the plurality of stacked lower portions 610l have a maximum width greater than that of the upper portion 610u. In some embodiments, the plurality of stud bumps 610 may have the height h6. In some embodiments, the height h6 may range from 65 um to 120 um. In some embodiments, the plurality of stacked lower portions 610l may have the diameter d2, and the upper portion 610u may have the diameter d1. In some embodiments, the plurality of stud bumps 610 may separate the substrate 102 from a housing structure. In some embodiments, the plurality of stud bumps 610 may be or otherwise comprise, for example, copper, iron, nickel, gold, silver, or some other suitable metal(s).

Figure 6E:
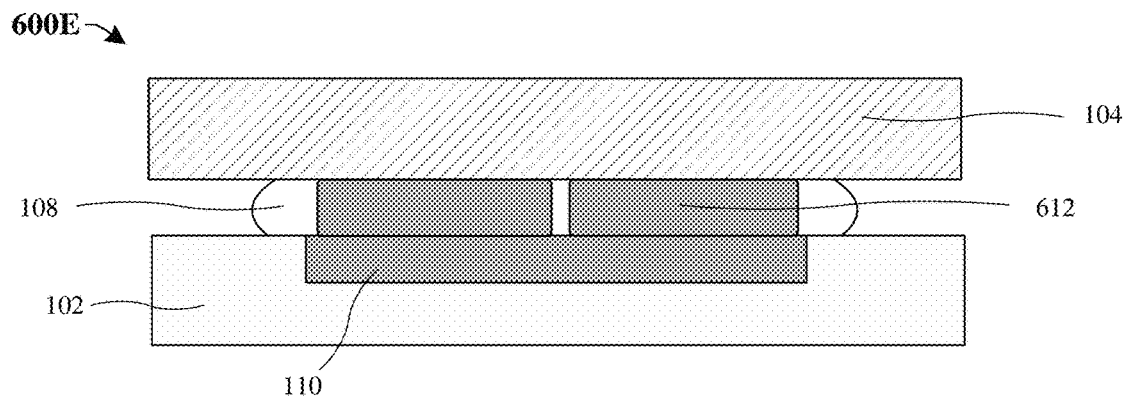

FIG. 6E illustrates a cross-sectional view 600E of some embodiments of a die stopper bump structure. The die stopper bump structure comprises a plurality of stud bumps 612. The plurality of stud bumps 612 vertically separate a substrate 102 from a semiconductor die 104. A metal pad 110 overlies the substrate 102, and the plurality of stud bumps 612 are disposed on the metal pad 110. An adhesive structure 108 surrounds outer sidewalls of each of the plurality of stud bumps 612. In some embodiments, a bottom surface of the plurality of stud bumps 612 directly contacts the metal pad 110. In some embodiments, a top surface of the plurality of stud bumps 612 directly contacts the semiconductor die 104. In some embodiments, the plurality of stud bumps 612 have a height ranging from 15 um to 25 um, and a diameter ranging from 75 um to 85 um. In some embodiments, the plurality of stud bumps 612 have a uniform height extending from the bottom surface of the plurality of stud bumps 612 to the top surface of the plurality of stud bumps 612. In some embodiments, the plurality of stud bumps 612 may separate the substrate 102 from a housing structure. In some embodiments, the plurality of stud bumps 612 may be or otherwise comprise, for example, copper, iron, nickel, gold, silver, or some other suitable metal(s).

Figure 6F:
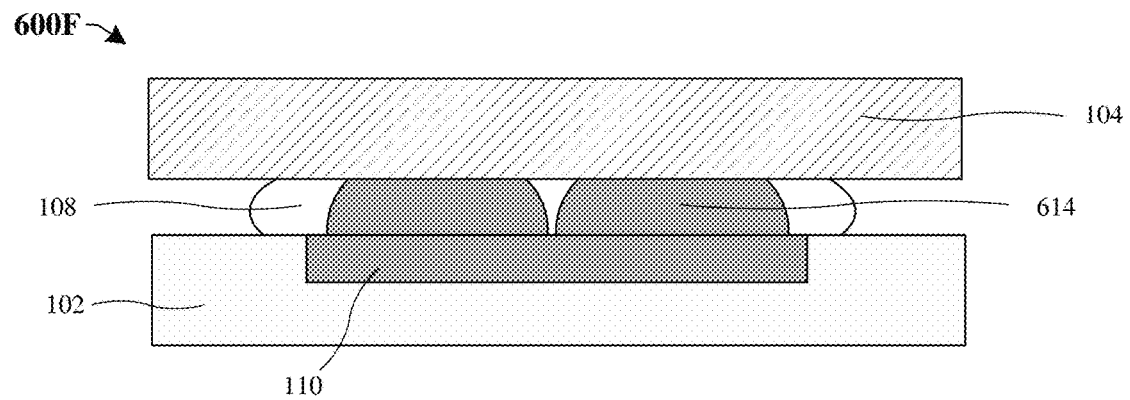

FIG. 6F illustrates a cross-sectional view 600F of some embodiments of a die stopper bump structure. The die stopper bump structure comprises a plurality of stud bumps 614 with a curved top surface. The plurality of stud bumps 614 vertically separate a substrate 102 from a semiconductor die 104. A metal pad 110 overlies the substrate 102, and the plurality of stud bumps 614 are disposed on the metal pad 110. An adhesive structure 108 surrounds outer sidewalls of each of the plurality of stud bumps 614. In some embodiments, a bottom surface of the plurality of stud bumps 614 directly contacts the metal pad 110. In some embodiments, a top surface of the plurality of stud bumps 614 directly contacts the semiconductor die 104. In some embodiments, the plurality of stud bumps 614 may serve as an electrical interconnect between the semiconductor die 104 and the substrate 102. In some embodiments, the plurality of stud bumps 614 have a height ranging from 15 um to 25 um, and a diameter ranging from 90 um to 110 um. In some embodiments, the plurality of stud bumps 614 may separate the substrate 102 from a housing structure. In some embodiments, the plurality of stud bumps 614 may be or otherwise comprise, for example, copper, iron, nickel, gold, silver, or some other suitable metal(s).

Figure 6G:
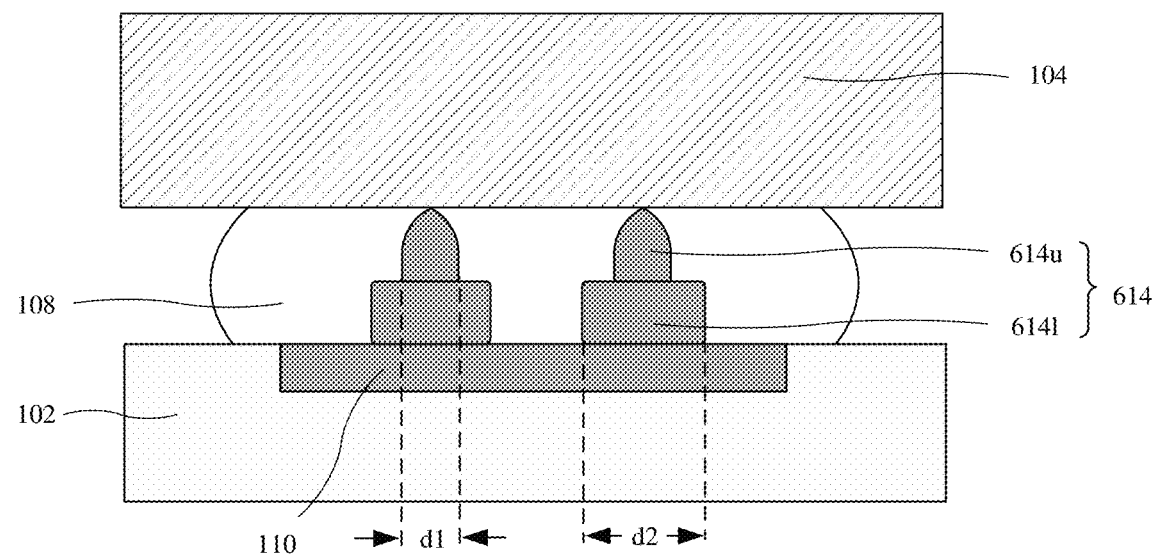

FIG. 6G illustrates a cross-sectional view 600G of some embodiments of a die stopper bump structure. The die stopper bump structure comprises a plurality of stud bumps 614, each comprising an upper portion 614$u$ and a lower portion 614$l$. The upper portion 614$u$ has a cross-sectional profile that is a truncated cone, wherein a bottom surface of the truncated cone faces the lower portion 614$l$ and wherein a top surface of the truncated cone directly contacts the semiconductor die 104. The plurality of stud bumps 614 vertically separate a substrate 102 from a semiconductor die 104. A metal pad 110 overlies the substrate 102, and the plurality of stud bumps 614 are disposed on the metal pad 110. An adhesive structure 108 surrounds outer sidewalls of each of the plurality of stud bumps 614. In some embodiments, a bottom surface of the lower portion 614$l$ of each stud bump 614 directly contacts the metal pad 110. In some embodiments, the plurality of stud bumps 614 have a height greater than the height h5. In some embodiments, the lower portion 614$l$ may have the diameter d2, and the upper portion 614$u$ may have the diameter d1. In some embodiments, the plurality of stud bumps 614 may separate the substrate 102 from a housing structure. In some embodiments, the plurality of stud bumps 614 may be or otherwise comprise, for example, copper, iron, nickel, gold, silver, or some other suitable metal(s).

With reference to FIGS. 7A-7F, a series of top views 700A-700F illustrate some embodiments of a stopper bump structure. The stopper bump structures may, for example, correspond to the die stopper bumps of FIG. 1.

Figure 7A:
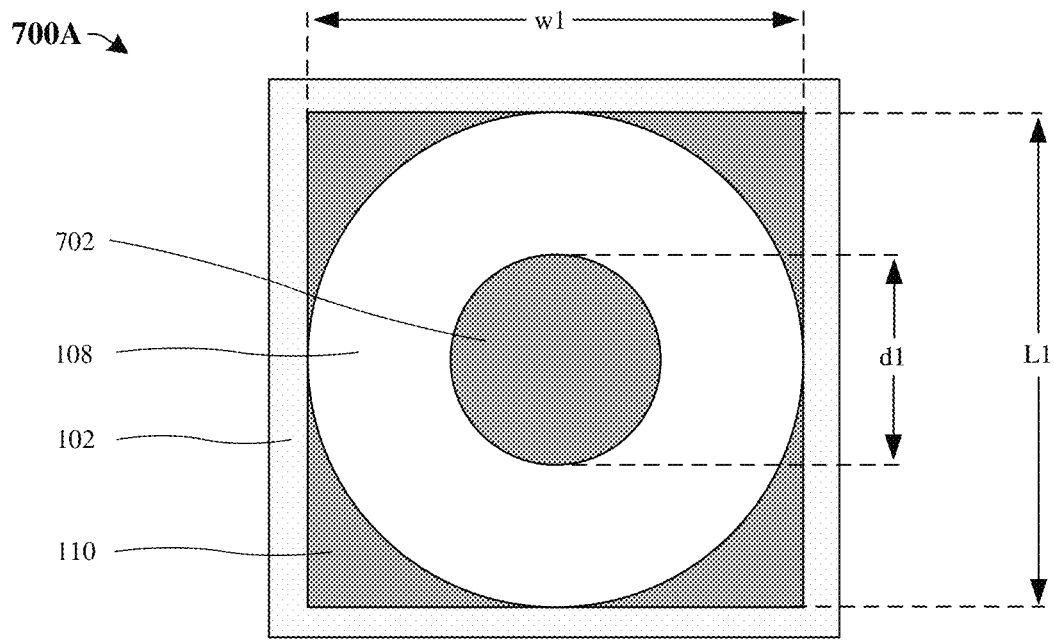
FIGS. 7A-7F illustrate a series of top views of some embodiments of a stopper bump structure.

FIG. 7A illustrates a top view 700A of some embodiments of a stopper bump structure. A metal pad 110 is disposed over a substrate 102. A stopper bump structure 702 is disposed over the metal pad 110, and an adhesive structure 108 surrounds the stopper bump structure 702. The stopper bump structure 702 comprises a single stopper bump disposed at the center of the metal pad 110. In some embodiments, the adhesive structure 108 uniformly surrounds the stopper bump structure 702. The metal pad 110 has a length L1 and a width w1. In some embodiments, the stopper bump structure 702 is a stud bump and the length L1 and the width w1 of the metal pad 110 both range from 100 um to 150 um. In some embodiments, the stopper bump structure is a metal ball bump and the length L1 and the width w1 of the metal pad 110 both range from 300 um to 450 um. The stopper bump structure 702 has a diameter d1. In some embodiments, the stopper bump structure is a stud bump and the diameter d1 ranges from 50 um to 100 um. In some embodiments, the stopper bump structure is a metal ball bump and the diameter d1 ranges from 250 um to 400 um. In some embodiments, the stopper bump structure 702 is more than 20 um away from any edge of the metal pad 110. In some embodiments, the stopper bump structure 702 may be or otherwise comprise, for example, tin, lead, copper, iron, nickel, gold, silver, some other suitable metal(s), or a combination of the foregoing.

Figure 7B:
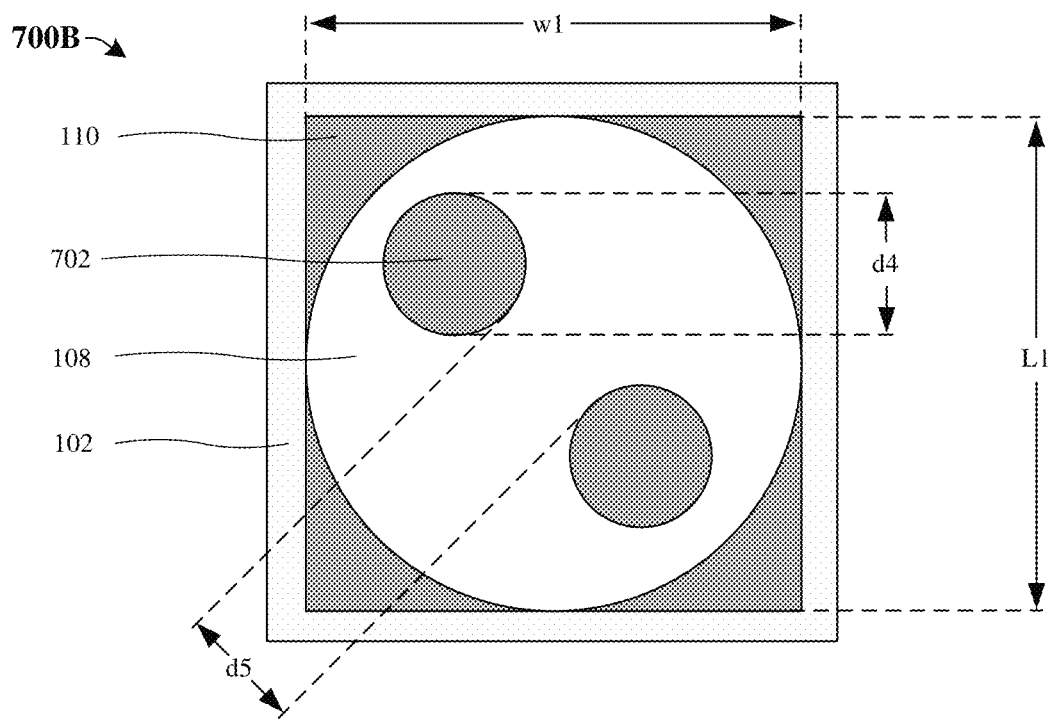

FIG. 7B illustrates a top view 700B of some embodiments of a stopper bump structure. A metal pad 110 is disposed over a substrate 102, a stopper bump structure 702 is disposed over the metal pad 110, and an adhesive structure 108 surrounds the stopper bump structure 702. The stopper bump structure 702 comprises a plurality stopper bumps, such that each stopper bump is separated in a diagonal direction. The metal pad 110 has a length L1 and a width w1. In some embodiments, the stopper bump structure 702 is a stud bump and the length L1 and the width w1 of the metal pad 110 both range from 150 um to 250 um. In some embodiments, the stopper bump structure is a metal ball bump and the length L1 and the width w1 of the metal pad 110 both range from 550 um to 950 um. The stopper bump structure 702 has a diameter d4. In some embodiments, the stopper bump structure is a stud bump and the diameter d4 ranges from 50 um to 100 um. In some embodiments, the stopper bump structure is a metal ball bump and the diameter d4 ranges from 250 um to 400 um. In some embodiments, the individual stopper bumps of the stopper bump structure 702 are separated by a distance d5 that is greater than 20 um. In some embodiments, the stopper bump structure 702 is greater than 20 um away from any edge of the metal pad 110.

Figure 7C:
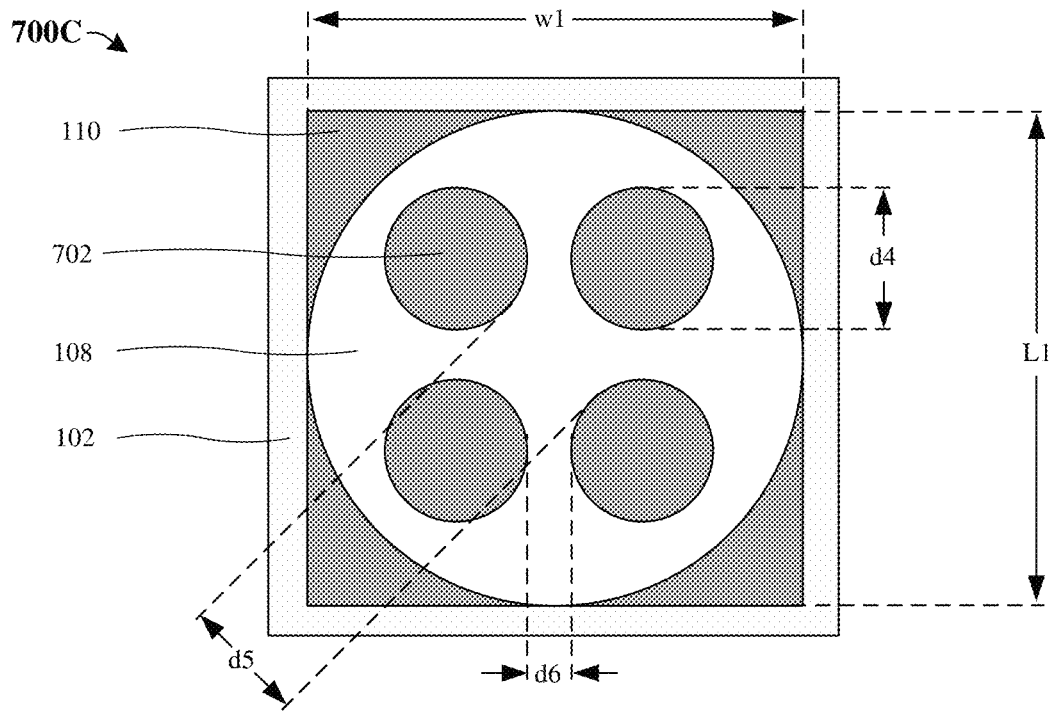

FIG. 7C illustrates a top view 700C of some embodiments of a stopper bump structure. A stopper bump structure 702 is disposed over a metal pad 110, which is disposed over a substrate 102. An adhesive structure 108 surrounds the stopper bump structure 702. The stopper bump structure 702 comprises a plurality of rows and a plurality of columns of stopper bumps. The metal pad 110 has a length L1 and a width w1. In some embodiments, the stopper bump structure 702 is a stud bump and the length L1 and the width w1 of the metal pad 110 both range from 150 um to 250 um. In some embodiments, the stopper bump structure is a metal ball bump and the length L1 and the width w1 of the metal pad 110 both range from 550 um to 950 um. The stopper bump structure 702 has a diameter d4. In some embodiments, the stopper bump structure is a stud bump and the diameter d4 ranges from 50 um to 100 um. In some embodiments, the stopper bump structure is a metal ball bump and the diameter d4 ranges from 250 um to 400 um. In some embodiments, the individual stopper bumps of the stopper bump structure 702 are separated by a diagonal distance d5 that is no less than 20 um, and a lateral distance d6 that is no less than 20 um. In some embodiments, the stopper bump structure 702 is no less than 20 um away from any edge of the metal pad 110.

Figures 7D, 7E, 7F:
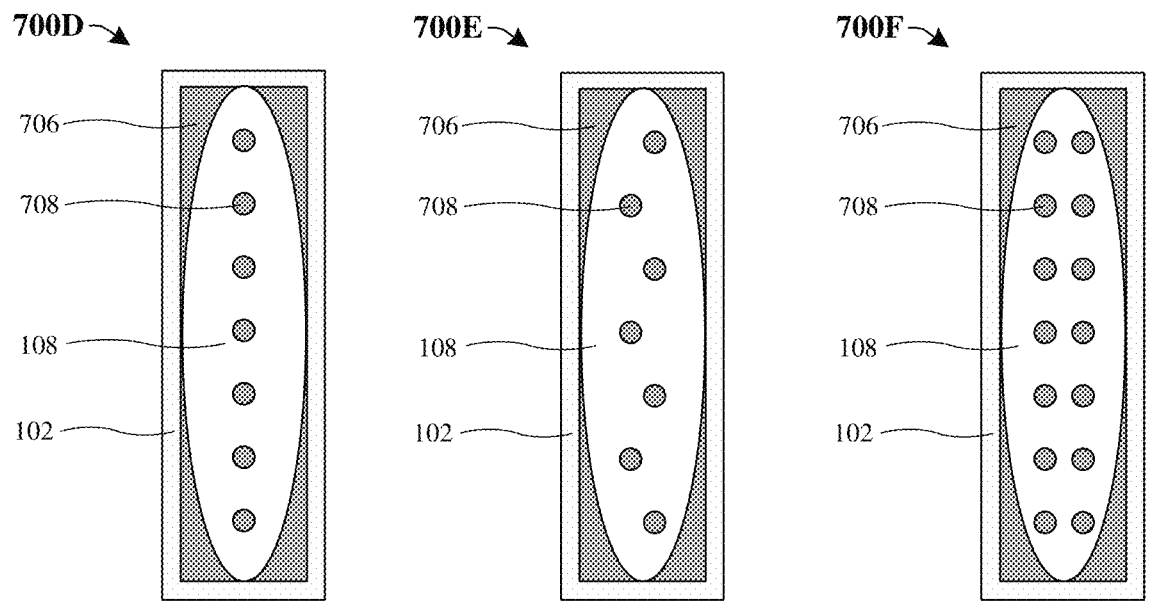

FIG. 7D illustrates a top view 700D of some embodiments of an elongated stopper bump structure. A stopper bump structure 708 is disposed over an elongated metal pad 706 that has a greater length than width. An adhesive structure 108 surrounds the stopper bump structure 702. The stopper bump structure 702 comprises a plurality of stopper bumps aligned along a width-wise center of the elongated metal pad 706 in a single row. In some embodiments, the stopper bump structure 708 is approximately 20 um to 30 um away from any edge of the metal pad 706. In some embodiments, the stopper bumps of the stopper bump structure 708 are approximately 20 um to 30 um away from each other. In some embodiments, the stopper bump structure 708 may be or otherwise comprise, for example, tin, lead, copper, iron, nickel, gold, silver, some other suitable metal(s), or a combination of the foregoing. The metal pad 706 may be or otherwise comprise, for example, copper, iron, nickel, gold, silver, or some other suitable metal(s).

FIG. 7E illustrates a top view 700E of some embodiments of an elongated stopper bump structure. A stopper bump structure 708 is disposed over an elongated metal pad 706 that has a greater length than width. An adhesive structure 108 surrounds the stopper bump structure 702. The stopper bump structure 702 comprises a plurality of stopper bumps aligned in a plurality of rows and a plurality of columns of stopper bumps, such that each row comprises a single stopper bump, and the individual stopper bumps of the stopper bump structure 708 are separated diagonally from each other.

FIG. 7F illustrates a top view 700F of some embodiments of an elongated stopper bump structure. A stopper bump structure 708 is disposed over an elongated metal pad 706 that has a greater length than width. An adhesive structure 108 surrounds the stopper bump structure 702. The stopper bump structure 702 comprises a plurality of stopper bumps aligned in a plurality of rows and a plurality of columns of stopper bumps.

With reference to FIGS. 8A-8E, a series of top views 800A-800E illustrate some embodiments of a metal pad structure that may underlie a plurality of die stopper bumps. The metal pad structure may, for example, correspond to the first plurality of metal pads 110 of FIG. 1. For example, in the previously described example of FIG. 1, metal pads 110 when viewed from a top view could be consistent with discrete metal pads 802 and elongated metal pads 808 of FIG. 8E; such that the semiconductor die 104 of FIG. 1 may have an outer boundary 104ob that lies outside of an outer boundary defined by discrete metal pads 802 and elongated metal pads 808 as shown in FIGS. 8A-8E.

Figure 8A:
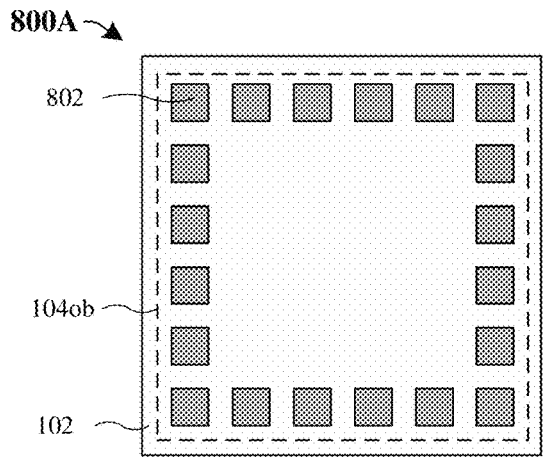
FIGS. 8A-8E illustrate a series of top views of some embodiments of a metal pad structure.

FIG. 8A illustrates a top view 800A of some embodiments of a metal pad structure. A plurality of discrete metal pads 802 overlies a peripheral region of a substrate 102. In some embodiments, each of the plurality of discrete metal pads 802 is square-shaped. An overlying semiconductor die would have an outer boundary outside of an outer boundary of the plurality of discrete metal pads 802.

Figure 8B:
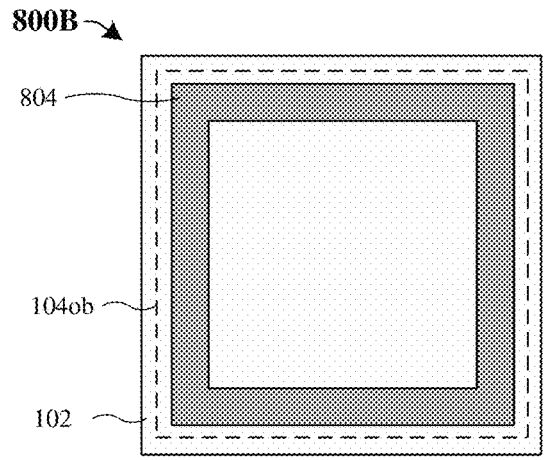

FIG. 8B illustrates a top view 800B of some embodiments of a metal pad structure. A continuous metal pad 804 overlies a peripheral region of a substrate 102. In some embodiments, the continuous metal pad 804 is ring-shaped with an inner surface and an outer surface that are both square shaped. An overlying semiconductor die would have an outer boundary outside of the outer surface of the continuous metal pad 804.

Figure 8C:
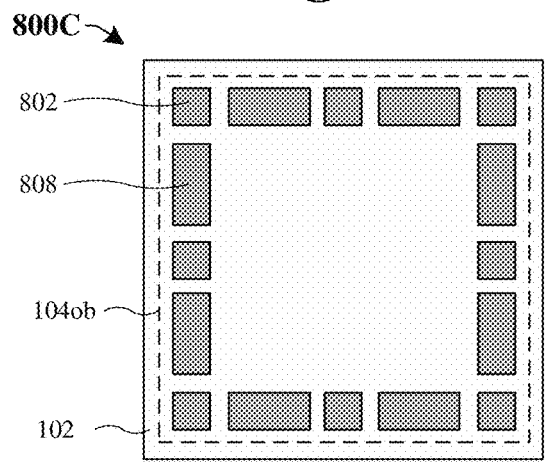

FIG. 8C illustrates a top view 800C of some embodiments of a metal pad structure. A plurality of elongated metal pads 808 and a plurality of discrete metal pads 802 overlie a peripheral region of a substrate 102. In some embodiments, each of the elongated metal pads 808 are rectangular. In some embodiments, each of the plurality of discrete metal pads 802 are square-shaped. An overlying semiconductor die would have an outer boundary outside of an outer boundary of the plurality of elongated metal pads 808 and an outer boundary of the plurality of discrete metal pads 802. In some embodiments, the elongated metal pads 808 alternate with the discrete metal pads 802 around a periphery of the substrate 102 in a square-shaped pattern.

Figure 8D:
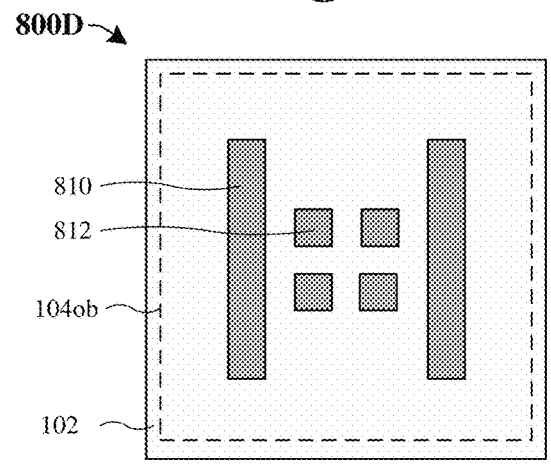

FIG. 8D illustrates a top view 800D of some embodiments of a metal pad structure. A plurality of central elongated metal pads 810 and a plurality of central discrete metal pads 812 overlie a central region of a substrate 102. The central elongated metal pads 810 are elongated parallel to each other. In some embodiments, the plurality of central discrete metal pads 812 are laterally between the plurality of central elongated metal pads 810, such that inner sidewalls of each of the plurality of central elongated metal pads 810 is facing the plurality of central discrete metal pads 812. In some embodiments, each of the central elongated metal pads 810 are rectangular. In some embodiments, each of the central discrete metal pads 812 are square. In some embodiments, the plurality of central discrete metal pads 812 are arranged into a plurality of columns and a plurality of rows. In some embodiments, the number of columns is equal to the number of rows.

Figure 8E:
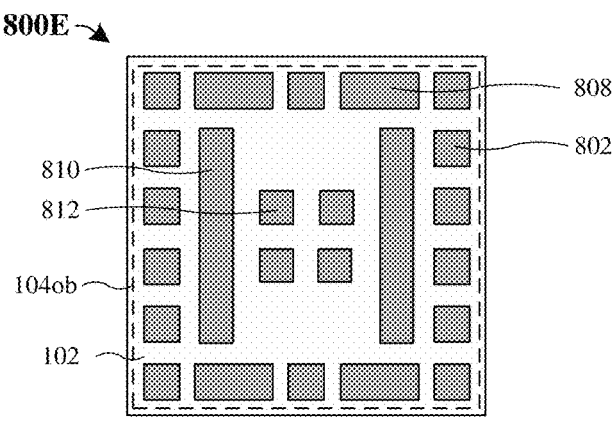

FIG. 8E illustrates a top view 800E of some embodiments of a metal pad structure. A plurality of central elongated metal pads 810 and a plurality of central discrete metal pads 812 overlie a central region of a substrate 102. A plurality of elongated metal pads 808 and a plurality of discrete metal pads 802 overlie a peripheral region of a substrate 102. The central elongated metal pads 810 are elongated parallel to each other. The elongated metal pads 808 are elongated parallel to each other. In some embodiments, outer sidewalls of the central elongated metal pads 810 face the plurality of discrete metal pads 810. In some embodiments, the elongated metal pads 808 alternate with the plurality of discrete metal pads 802 on two opposing ends of the substrate 102. In some embodiments, each of the central elongated metal pads 810 and each of the elongated metal pads 808 are rectangular. In some embodiments, a length of the central elongated metal pads 810 is greater than that of the elongated metal pads 808. In some embodiments, each of the central discrete metal pads 812 and each of the discrete metal pads 802 are square. An overlying semiconductor die would have an outer boundary outside of an outer boundary of the plurality of elongated metal pads 808 and an outer boundary of the plurality of discrete metal pads 802.

With reference to FIGS. 9A-9F, a series of cross sections 900A-900F illustrate some embodiments of a method for forming an IC comprising a stopper bump structure. The IC may, for example, correspond to the IC of FIG. 1. Although FIGS. 9A-9F are described in relation to a method, it will be appreciated that the structures disclosed in FIGS. 9A-9F are not limited to such a method, but instead may stand alone as structures independent of the method.

Figure 9A:
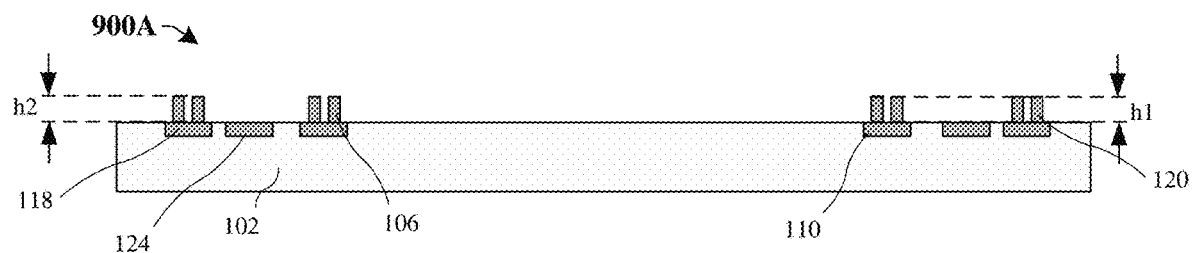
FIGS. 9A-9F illustrate a series of cross-sectional views for a method of forming an IC comprising a stopper bump structure.

As illustrated by the cross-sectional view 900A of FIG. 9A, a substrate 102 is provided. A first plurality of metal pads 110, a third plurality of metal pads 118, and a fourth plurality of metal pads 124 are formed on a top surface of the substrate 102 through a bond pad formation process. The bond pad formation process may be or otherwise comprise, for example, photolithography, deposition of a material through chemical-vapor deposition (CVD), physical-vapor deposition (PVD), electroplating, metal printing (3D printing), or some other suitable deposition process, and chemical-mechanical planarization (CMP) of excess material. A plurality of die stopper bumps 106 is formed on a top surface of the first plurality of metal pads 110 at a first height h1 by a stopper bump formation process. In some embodiments, the stopper bump formation process may comprise using a wire bonder to provide a stopper bump material onto a metal pad to form ball bond or wedge bond, and then trimming the top of the ball bond or wedge bond (and/or wire at the of the ball bond or wedge bond) to form the plurality of die stopper bumps 106. A plurality of housing stopper bumps 120 is formed on a top surface of the third plurality of metal pads 118 at a second height h2 by the stopper bump formation process.

Figure 9B:
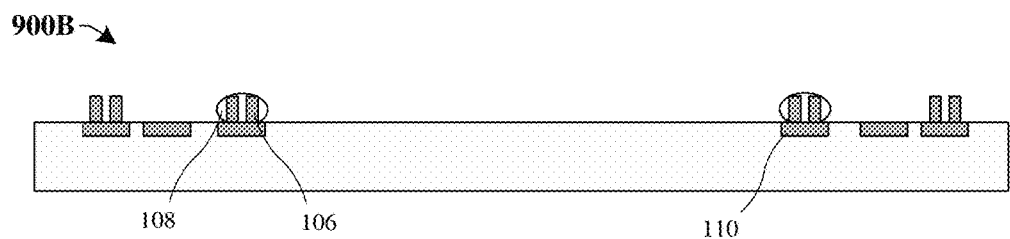

As illustrated by the cross-sectional view 900B of FIG. 9B, a first plurality of adhesive structures 108 is formed over the first plurality of metal pads 110 by the stopper bump formation process such that the adhesive structures 108 surround each of the plurality of die stopper bumps 106. For instance, the first plurality of adhesive structures 108 may be formed by pumping, squeezing, or otherwise providing a liquid around the plurality of die stopper bumps 106 and onto the first plurality of metal pads 110.

Figure 9C:
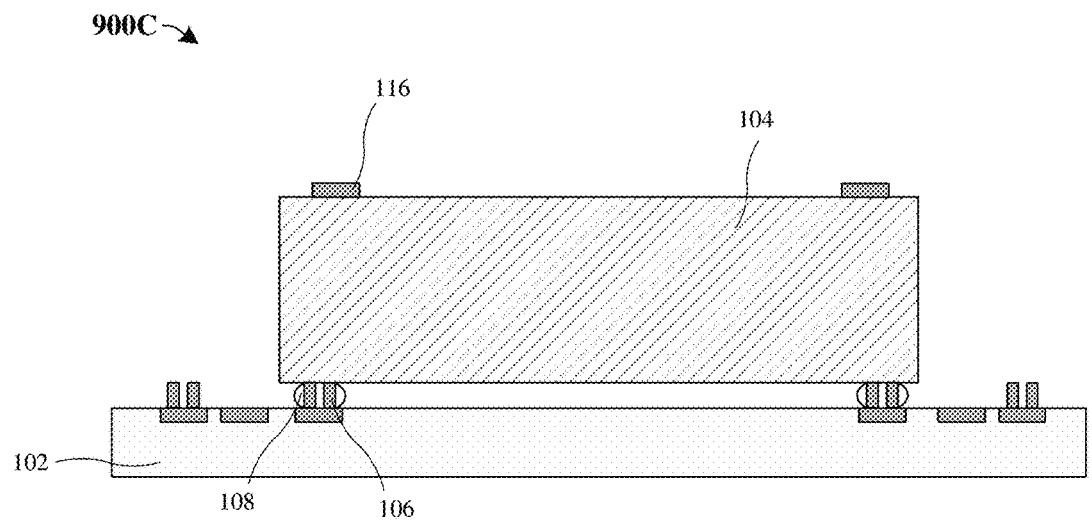

As illustrated by the cross-sectional view 900C of FIG. 9C, a semiconductor die 104 is provided. The semiconductor die 104 includes a second plurality of metal pads 116 along a frontside surface of the semiconductor die 104. A backside surface of the semiconductor die 104 is attached to the plurality of die stopper bumps 106 such that the semiconductor die 104 overlies the substrate 102. After the semiconductor die 104 is attached, the first plurality of adhesive structures 108 is cured so the liquid of the first plurality of adhesive structures 108 hardens to a solid material.

Figure 9D:
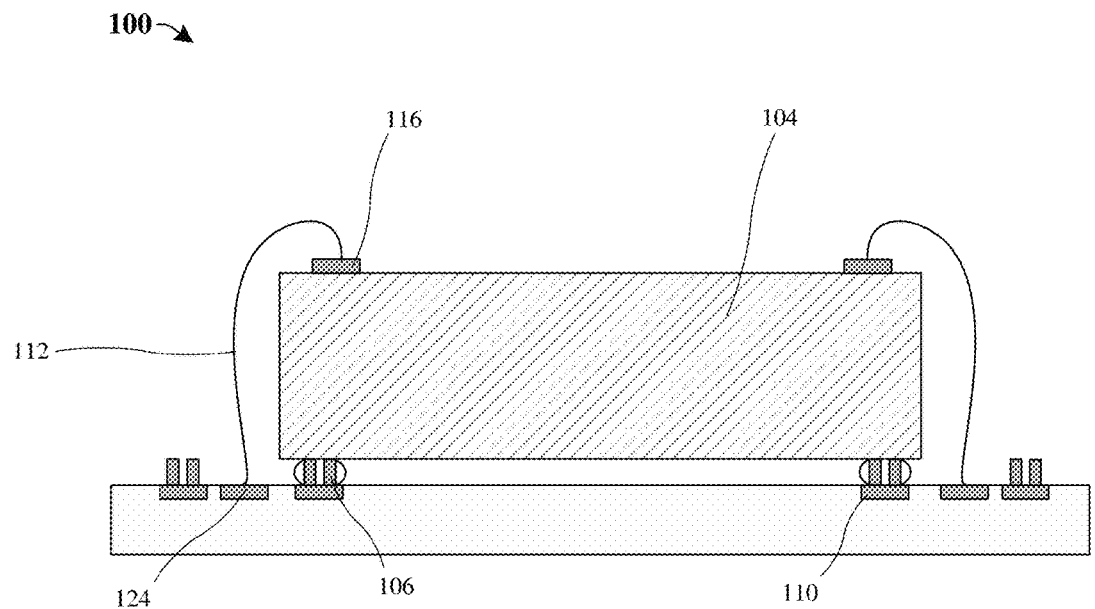

As illustrated by the cross-sectional view 900D of FIG. 9D, metal wires 112 are formed, connecting the second plurality of metal pads 116 to the fourth plurality of metal pads 124. In some embodiments, the metal wires 112 may be formed with a process similar to that used in the formation of the plurality of die stopper bumps 106, such that a size of the plurality of die stopper bumps 106 may be correlated to a thickness of the metal wires 112.

Figure 9E:
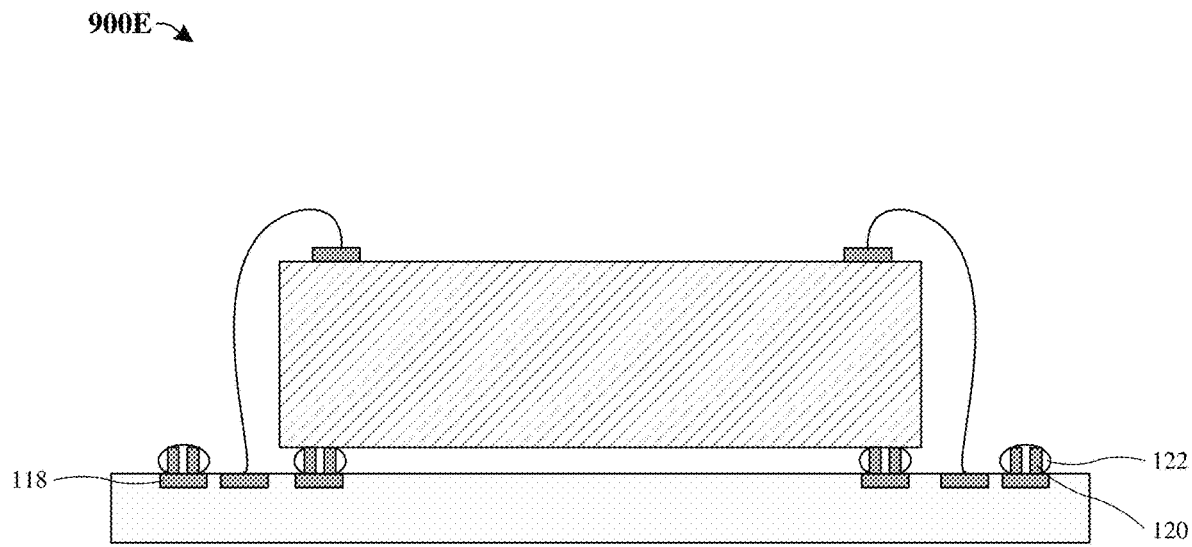

As illustrated by the cross-sectional view 900E of FIG. 9E, a second plurality of adhesive structures 122 is formed over the third plurality of metal pads 118 such that the adhesive structures 122 surround each of the plurality of housing stopper bumps 120. For instance, the second plurality of adhesive structures 122 may be formed by pumping, squeezing, or otherwise providing a liquid around the plurality of housing stopper bumps 120 and onto the third plurality of metal pads 118.

Figure 9F:
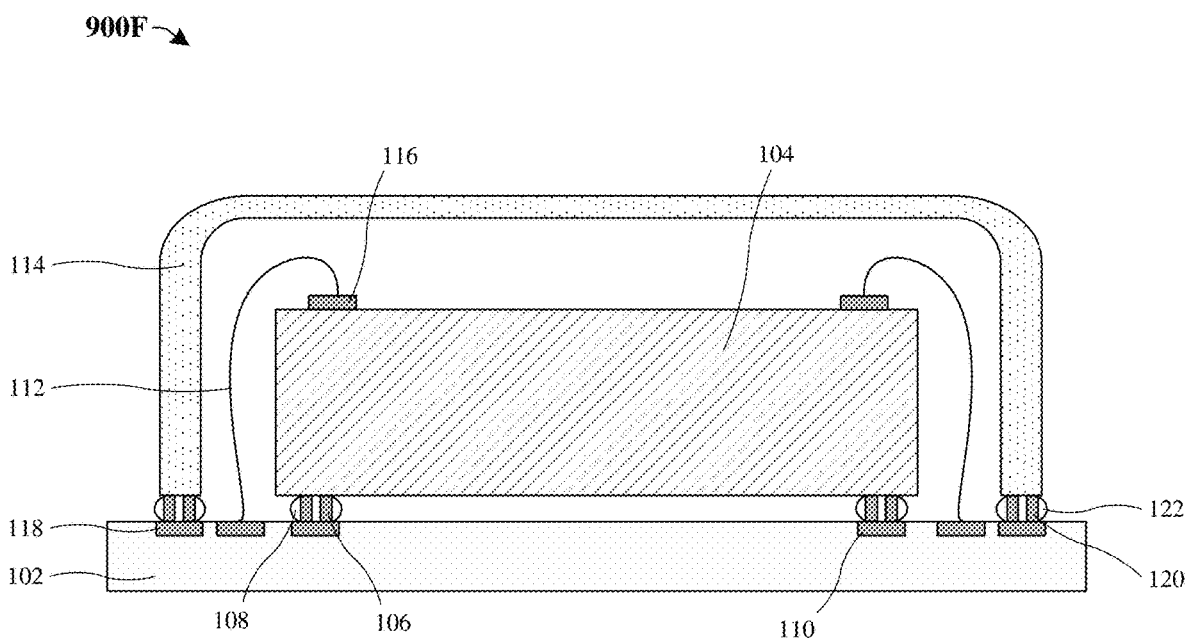

As illustrated by the cross-sectional view 900F of FIG. 9F, a housing structure 114 is provided. A bottom surface of the housing structure 114 is then placed into contact with the liquid of the second plurality of adhesive structures 122 and is pressed down until the housing stopper bumps 120 are firmly positioned between the substrate 102 and semiconductor die 104. Thus, the housing structure 114 is attached to the plurality of housing stopper bumps 120 such that the housing structure 114 overlies and is vertically separated from the substrate 102. After the housing structure 114 is attached, the second plurality of adhesive structures 122 is cured.

Figure 9G:
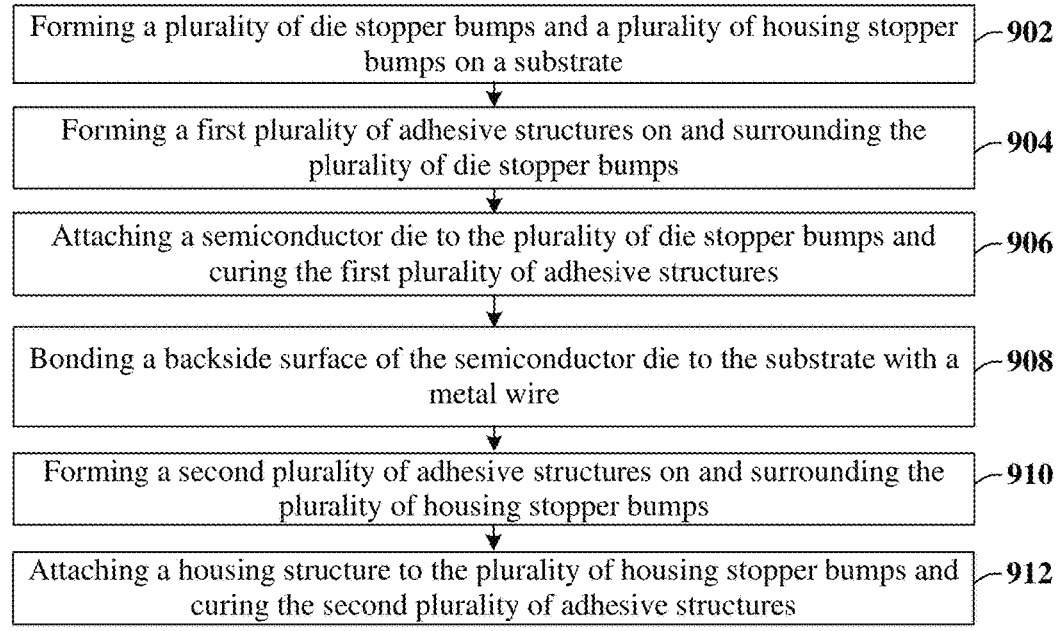
FIG. 9G illustrates a flowchart of some embodiments of the method consistent with FIGS. 9A-9F.

With respect to FIG. 9G, a flowchart 900G of some embodiments of a method for forming an IC comprising a stopper bump structure is illustrated. The IC may, for example, correspond to the IC of FIGS. 9A-9F.

While flowchart 900G is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a plurality of die stopper bumps and a plurality of housing stopper bumps are formed on a substrate. See, for example, FIG. 9A.

At 904, a first plurality of adhesive structures is formed on and surrounds the plurality of die stopper bumps. See, for example, FIG. 9B.

At 906, a semiconductor die is attached to the plurality of die stopper bumps, and the first plurality of adhesive structures is cured. See, for example, FIG. 9C.

At 908, a frontside surface of the semiconductor die is bonded to the substrate with a metal wire. See, for example, FIG. 9D.

At 910, a second plurality of adhesive structures is formed on and surrounds the plurality of housing stopper bumps. See, for example, FIG. 9E.

At 912, a housing structure is attached to the plurality of housing stopper bumps, and the second plurality of adhesive structures is cured. See, for example, FIG. 9F.

With reference to FIGS. 10A-10G, a series of cross sections 1000A-1000G illustrate some embodiments of a method for forming an IC comprising a stopper bump structure separating a housing structure from a semiconductor die. The IC may, for example, correspond to the IC of FIG. 2. Although FIGS. 10A-10G are described in relation to a method, it will be appreciated that the structures disclosed in FIGS. 10A-10G are not limited to such a method, but instead may stand alone as structures independent of the method.

Figure 10A:
FIGS. 10A-10G illustrate a series of cross-sectional views for a method of forming an IC comprising a stopper bump structure separating a housing structure from a semiconductor die.

As illustrated by the cross-sectional view 1000A of FIG. 10A, a housing structure 114 is provided. A plurality of metal housing pads 202 are formed along a lateral inner surface of the housing structure 114 by the bond pad formation process, such that a first surface of the plurality of metal housing pads 202 directly contacts the housing structure 114. A plurality of die stopper bumps 204 is formed on second surface of the plurality of metal housing pads 202 that is opposite the first surface by the stopper bump formation process.

Figure 10B:
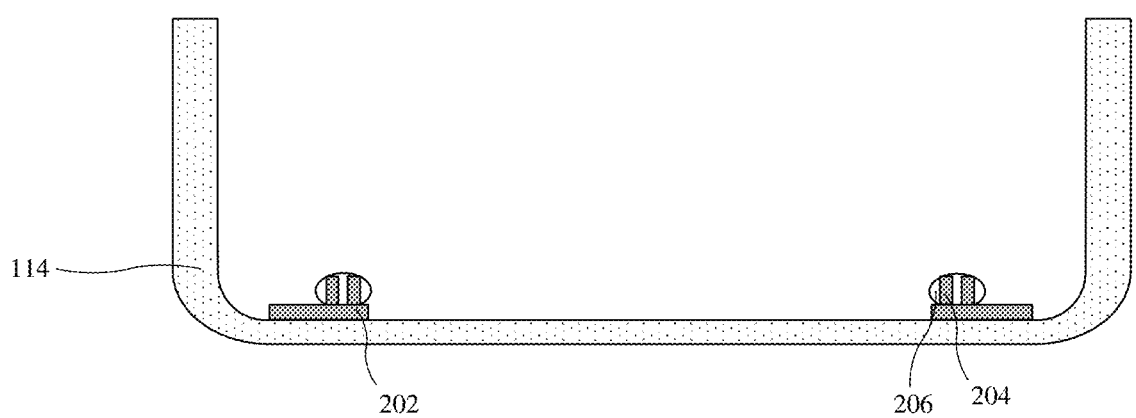

As illustrated by the cross-sectional view 1000B of FIG. 10B, a plurality of housing adhesive structures 206 formed along the second surface of the plurality of metal housing pads 202 such that the housing adhesive structures 206 surround each of the plurality of die stopper bumps 204. For instance, the first plurality of housing adhesive structures 206 may be formed by pumping, squeezing, or otherwise providing a liquid around the plurality of die stopper bumps 204 and onto the plurality of metal housing pads 202.

Figure 10C:
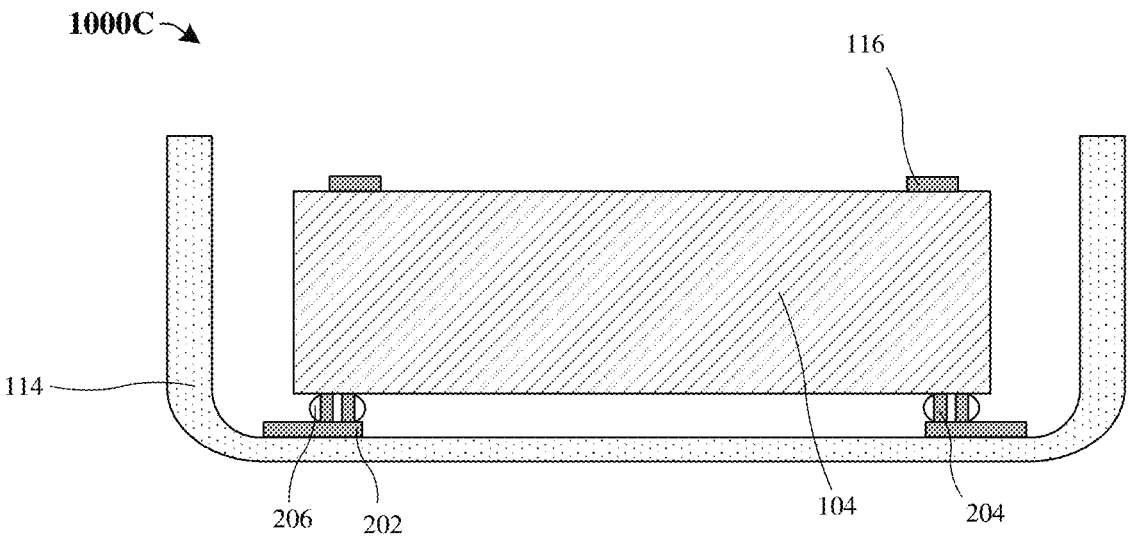

As illustrated by the cross-sectional view 1000C of FIG. 10C, a semiconductor die 104 is provided. The semiconductor die 104 includes a second plurality of metal pads 116 along a frontside surface of the semiconductor die 104. A backside surface of the semiconductor die 104 is then attached to the plurality of die stopper bumps 204 such that the semiconductor die 104 comprises sidewalls surrounded by the housing structure 114. After the semiconductor die 104 is attached, the plurality of adhesive structures 206 is cured.

Figure 10D:
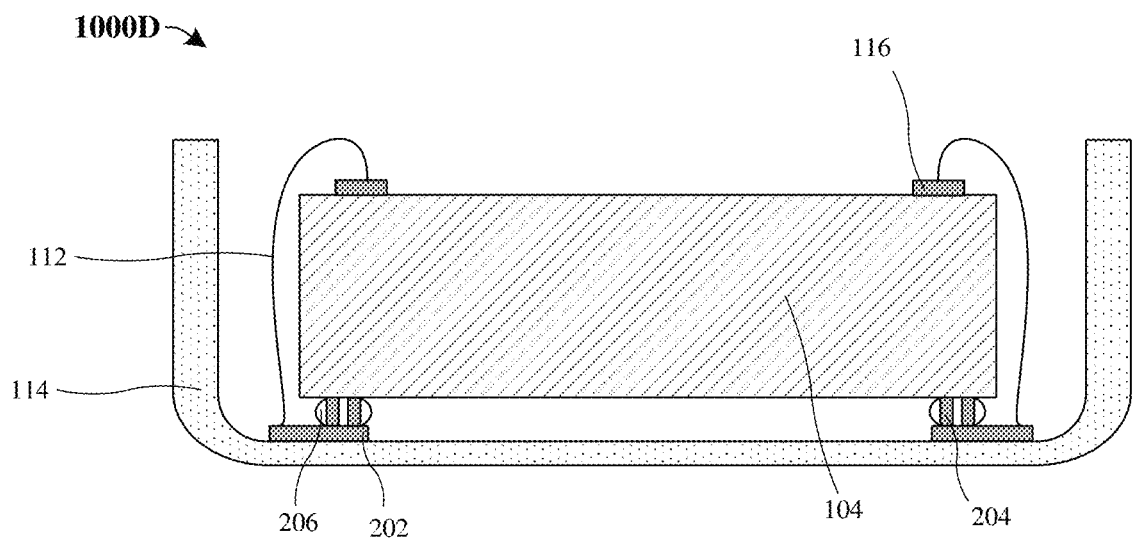

As illustrated by the cross-sectional view 1000D of FIG. 10D, metal wires 112 are formed, connecting the second plurality of metal pads 116 to the plurality of metal housing pads 202. In some embodiments, the metal wires 112 may be formed with a process similar to that used in the formation of the plurality of die stopper bumps 204, such that a size of the plurality of die stopper bumps 204 may be correlated to a thickness of the metal wires 112.

Figure 10E:

As illustrated by the cross-sectional view 1000E of FIG. 10E, a substrate 102 is provided. A third plurality of metal pads 118 is formed on a top surface of the substrate 102 by the bond pad formation process. A plurality of housing stopper bumps 120 is formed on a top surface of the third plurality of metal pads 118 by the stopper bump formation process.

Figure 10F:

As illustrated by the cross-sectional view 1000F of FIG. 10F, a second plurality of adhesive structures 122 is formed over the third plurality of metal pads 118 such that the adhesive structures 122 surround each of the plurality of housing stopper bumps 120.

Figure 10G:
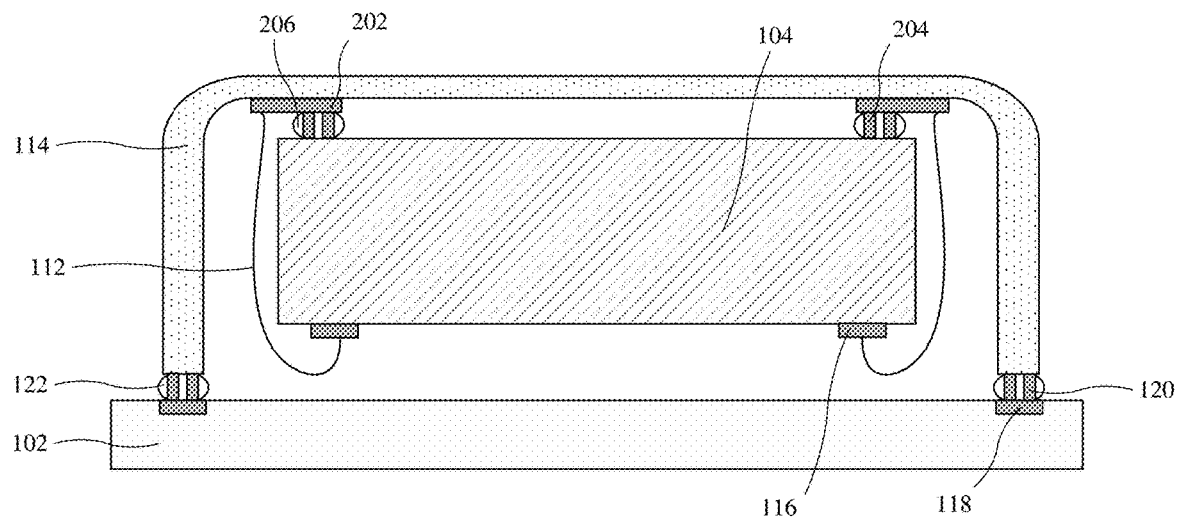

As illustrated by the cross-sectional view 1000G of FIG. 10G, a bottom surface of the housing structure 114 is then attached to the plurality of housing stopper bumps 120 such that the housing structure 114 and the semiconductor die 104 overlie and are vertically separated from the substrate 102. After the housing structure 114 is attached, the second plurality of adhesive structures 122 is cured.

Figure 10H:
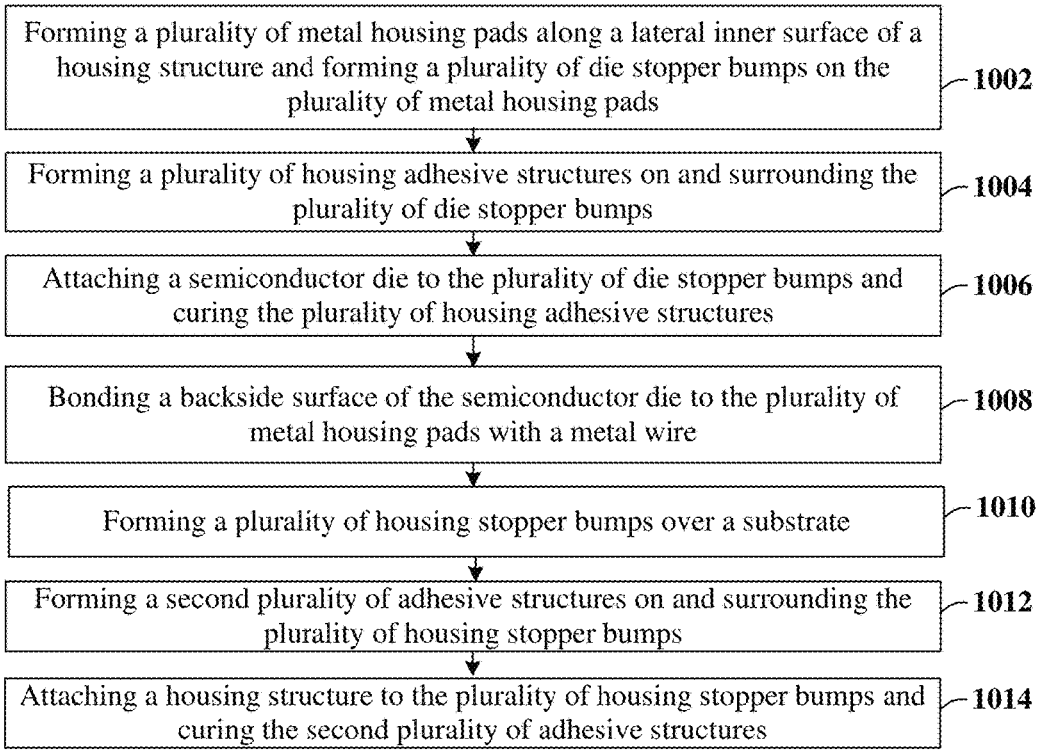
FIG. 10H illustrates a flowchart of some embodiments of the method consistent with FIGS. 10A-10G.

With respect to FIG. 10H, a flowchart 1000H of some embodiments of a method for forming an IC comprising a stopper bump structure separating a housing structure from a semiconductor die. The IC may, for example, correspond to the IC of FIGS. 10A-10G.

While flowchart 1000H is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1002, a plurality of metal housing pads is formed along a lateral inner surface of a housing structure, and a plurality of die stopper bumps are formed on the plurality of metal housing pads. See, for example, FIG. 10A.

At 1004, a plurality of housing adhesive structures is formed on and surrounds the plurality of die stopper bumps. See, for example, FIG. 10B.

At 1006, a semiconductor die is attached to the plurality of die stopper bumps, and the first plurality of adhesive structures is cured. See, for example, FIG. 10C.

At 1008, a frontside surface of the semiconductor die is bonded to the plurality of metal housing pads with a metal wire. See, for example, FIG. 10D.

At 1010, a plurality of housing stopper bumps is formed over a substrate. See, for example, FIG. 10E.

At 1012, a second plurality of adhesive structures is formed on and surrounds the plurality of housing stopper bumps. See, for example, FIG. 10F.

At 1014, a housing structure is attached to the plurality of housing stopper bumps and the second plurality of adhesive structures is cured. See, for example, FIG. 10G.

With reference to FIGS. 11A-11I, a series of cross sections 1100A-1100I illustrate some embodiments of a method for forming an IC comprising a stopper bump structure separating stacked ICs. The IC may, for example, correspond to the IC of FIG. 3. Although FIGS. 11A-11I are described in relation to a method, it will be appreciated that the structures disclosed in FIGS. 11A-11I are not limited to such a method, but instead may stand alone as structures independent of the method.

Figure 11A:
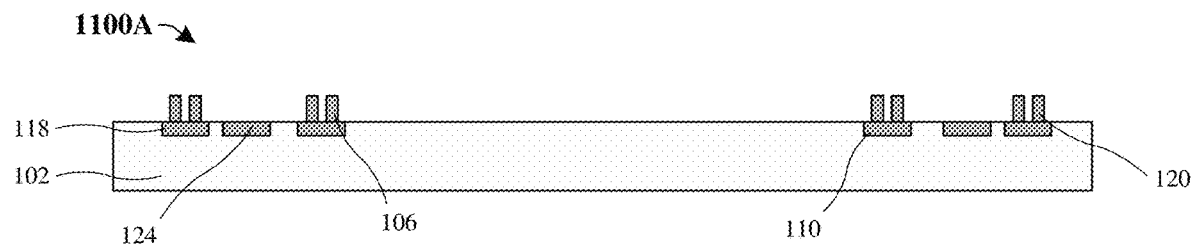
FIGS. 11A-11I illustrate a series of cross-sectional views for a method of forming an IC comprising a stopper bump structure separating stacked ICs.

As illustrated by the cross-sectional view 1100A of FIG. 11A, a substrate 102 is provided. A first plurality of metal pads 110, a third plurality of metal pads 118, and a fourth plurality of metal pads 124 are formed over the substrate 102 by the bond pad formation process. A plurality of die stopper bumps 106 is formed over the first plurality of metal pads 110 by the stopper bump formation process. A plurality of housing stopper bumps 120 is formed over the third plurality of metal pads 118 by the stopper bump formation process.

Figure 11B:
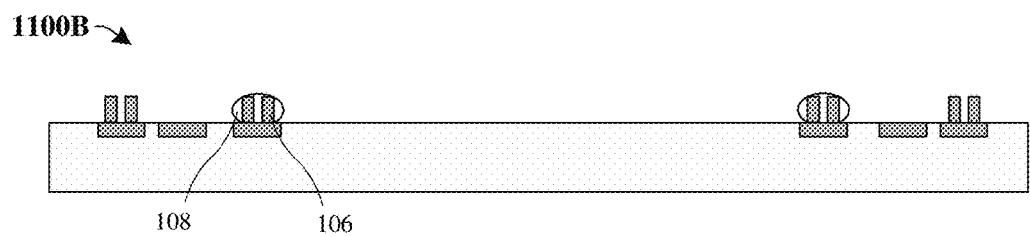

As illustrated by the cross-sectional view 1100B of FIG. 11B, a first plurality of adhesive structures 108 is formed, surrounding each of the plurality of die stopper bumps 106.

Figure 11C:
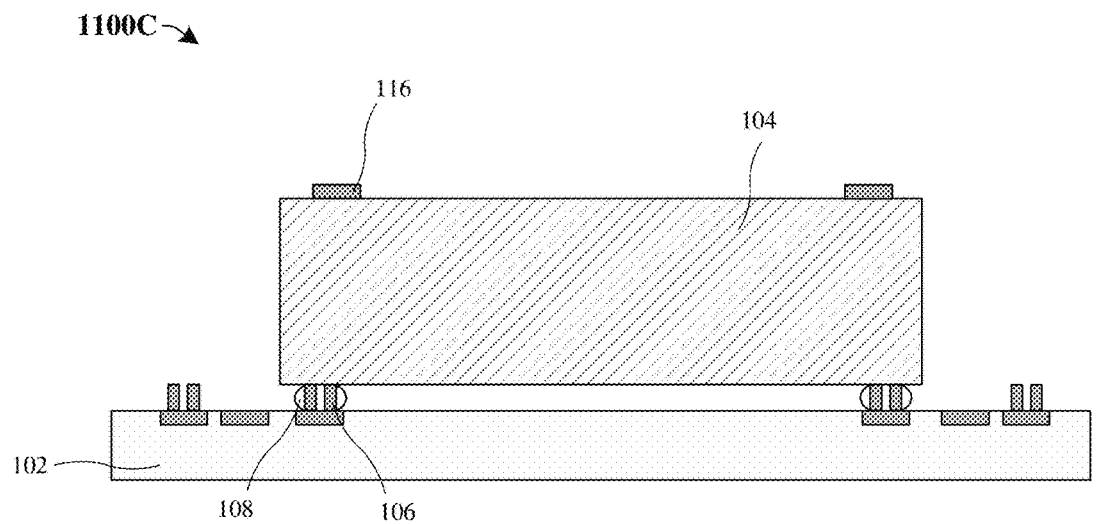

As illustrated by the cross-sectional view 1100C of FIG. 11C, a semiconductor die 104 is provided. The semiconductor die 104 includes a second plurality of metal pads 116 along a frontside surface of the semiconductor die 104. A backside surface of the semiconductor die 104 is then attached to the plurality of die stopper bumps 106. After the semiconductor die 104 is attached, the first plurality of adhesive structures 108 is cured.

Figure 11D:
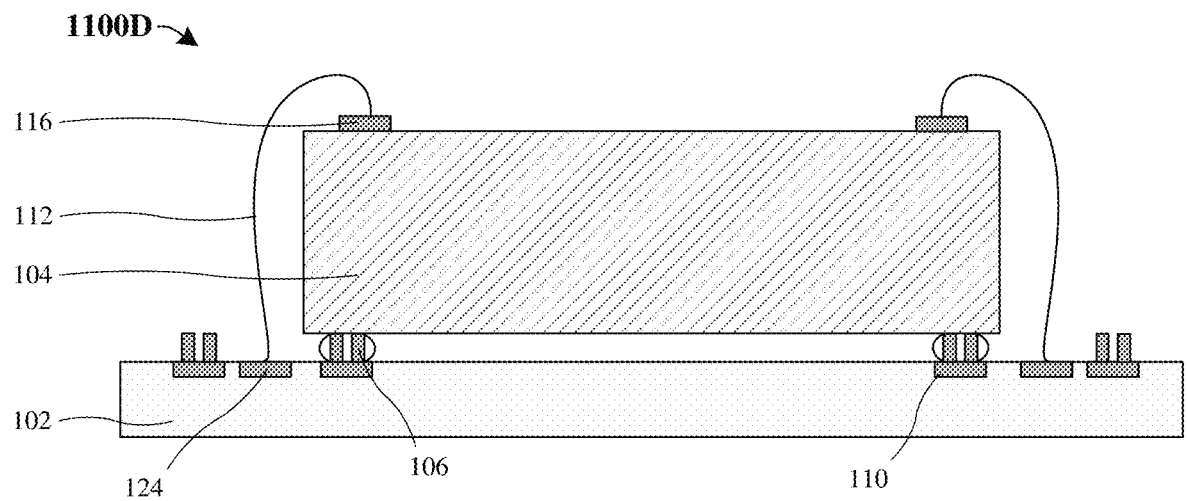

As illustrated by the cross-sectional view 1100D of FIG. 11D, metal wires 112 are formed, connecting the second plurality of metal pads 116 to the fourth plurality of metal pads 124, different than the metal pads underlying the plurality of die stopper bumps 106. In some embodiments, the metal wires 112 are connected to metal pads of the first plurality of metal pads 110 that are separated from the plurality of die stopper bumps 106.

Figure 11E:
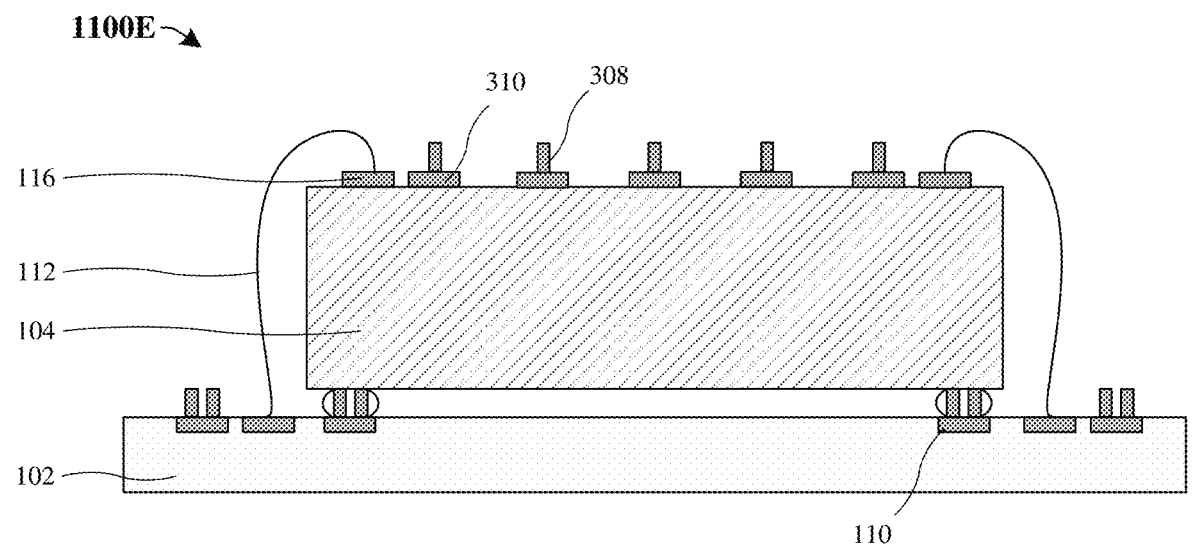

As illustrated by the cross-sectional view 1100E of FIG. 11E, a plurality of metal die pads 310 are formed along a frontside surface of the semiconductor die 104 by the bond pad formation process. In some embodiments, the plurality of metal die pads 310 are formed laterally inside of the second plurality of metal pads 116. A plurality of overlying die stopper bumps 308 are formed over the plurality of metal die pads 310 by the stopper bump formation process. In some embodiments, the plurality of overlying die stopper bumps 308 are formed with a similar process to that which forms the metal wires 112.

Figure 11F:
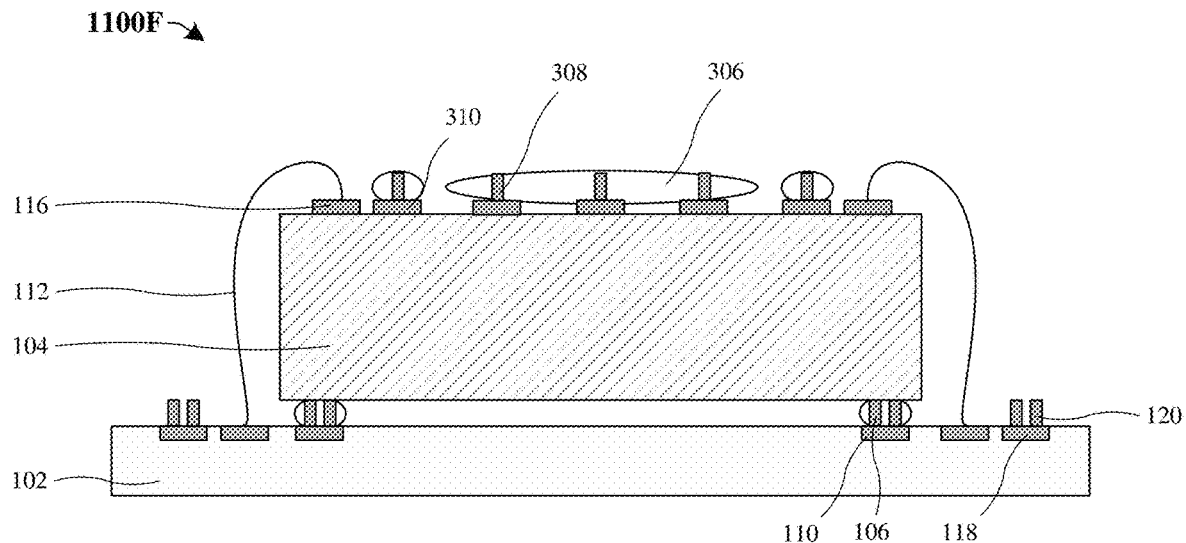

As illustrated by the cross-sectional view 1100F of FIG. 11F, a plurality of overlying adhesive structures 306 is formed over the plurality of metal die pads 310 such that the overlying adhesive structures 306 surround each of the plurality of overlying die stopper bumps 308. In some embodiments, a single overlying adhesive structure of the plurality of overlying adhesive structures 306 may surround only a single overlying die stopper bump of the plurality of overlying die stopper bumps 308. In some embodiments, a single overlying adhesive structure of the plurality of overlying adhesive structures 306 may surround more than one die stopper bump of the plurality of overlying die stopper bumps 308. For instance, the plurality of overlying adhesive structures 306 may be formed by pumping, squeezing, or otherwise providing a liquid around the plurality of overlying die stopper bumps 308 and onto the plurality of metal die pads 310.

Figure 11G:
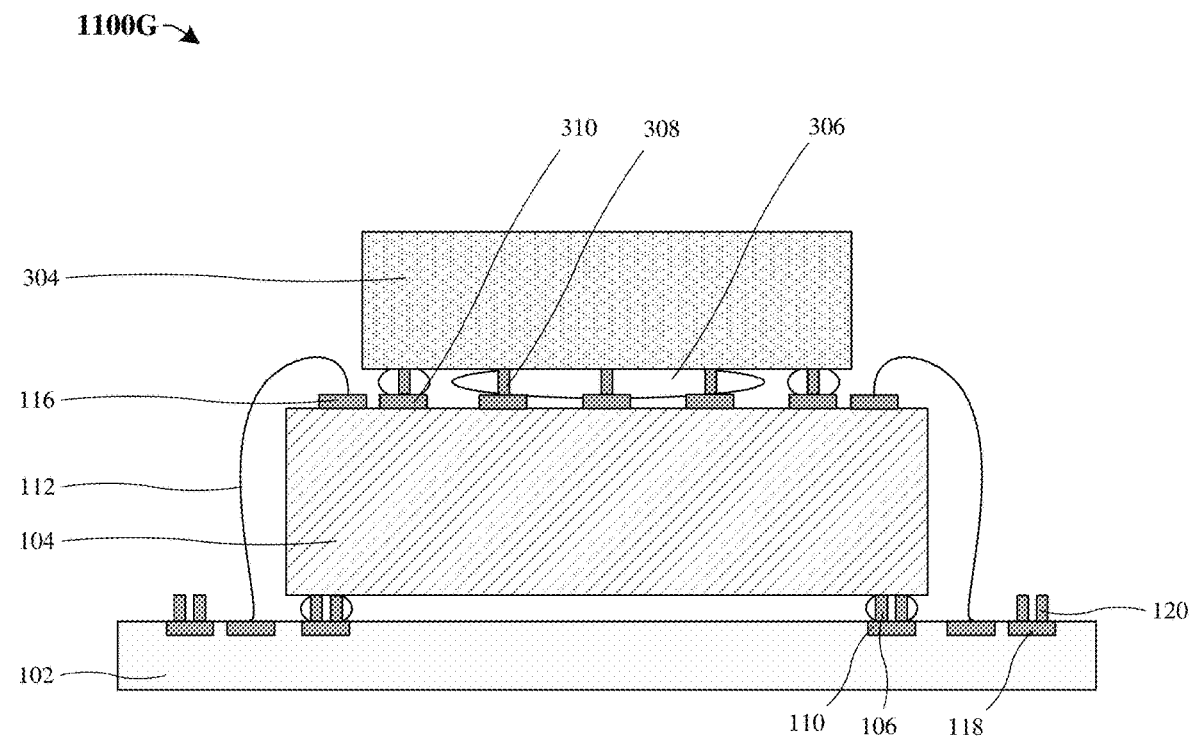

As illustrated by the cross-sectional view 1100G of FIG. 11G, a stacked semiconductor die 304 is provided. A backside surface of the stacked semiconductor die 304 is then attached to the plurality of overlying die stopper bumps 308, such that the stacked semiconductor die 304 overlies the semiconductor die 104. After the semiconductor die 104 is attached, the plurality of overlying adhesive structures 306 is cured.

Figure 11H:
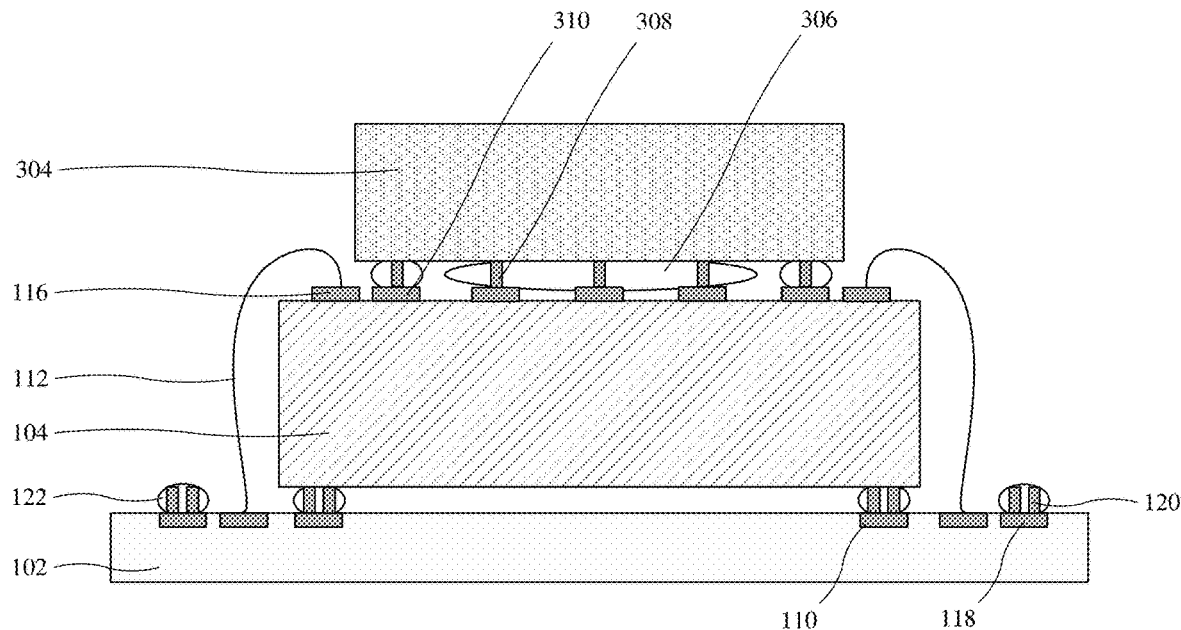

As illustrated by the cross-sectional view 1100H of FIG. 11H, a second plurality of adhesive structures 122 is formed over the third plurality of metal pads 118 such that the adhesive structures 122 surround each of the plurality of housing stopper bumps 120.

Figure 11I:
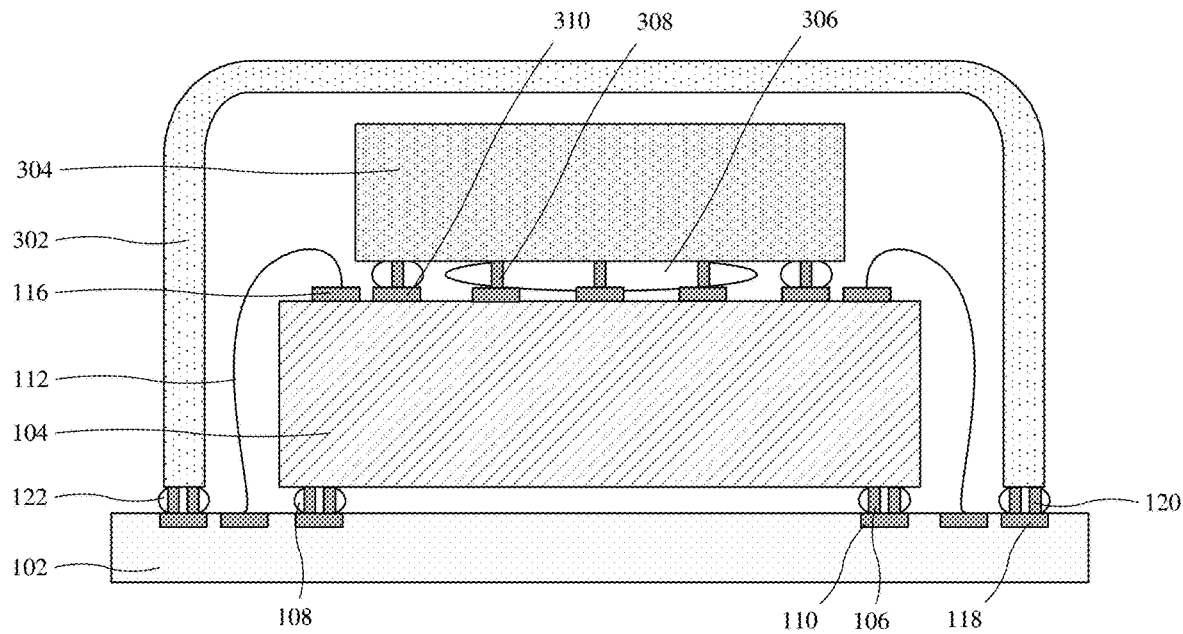

As illustrated by the cross-sectional view 1100I of FIG. 11I, a housing structure is provided. The housing structure 302 is then attached to the plurality of housing stopper bumps 120 such that the housing structure 302 overlies the stacked semiconductor die 304. After the housing structure 302 is attached, the second plurality of adhesive structures 122 is cured.

Figure 11J:
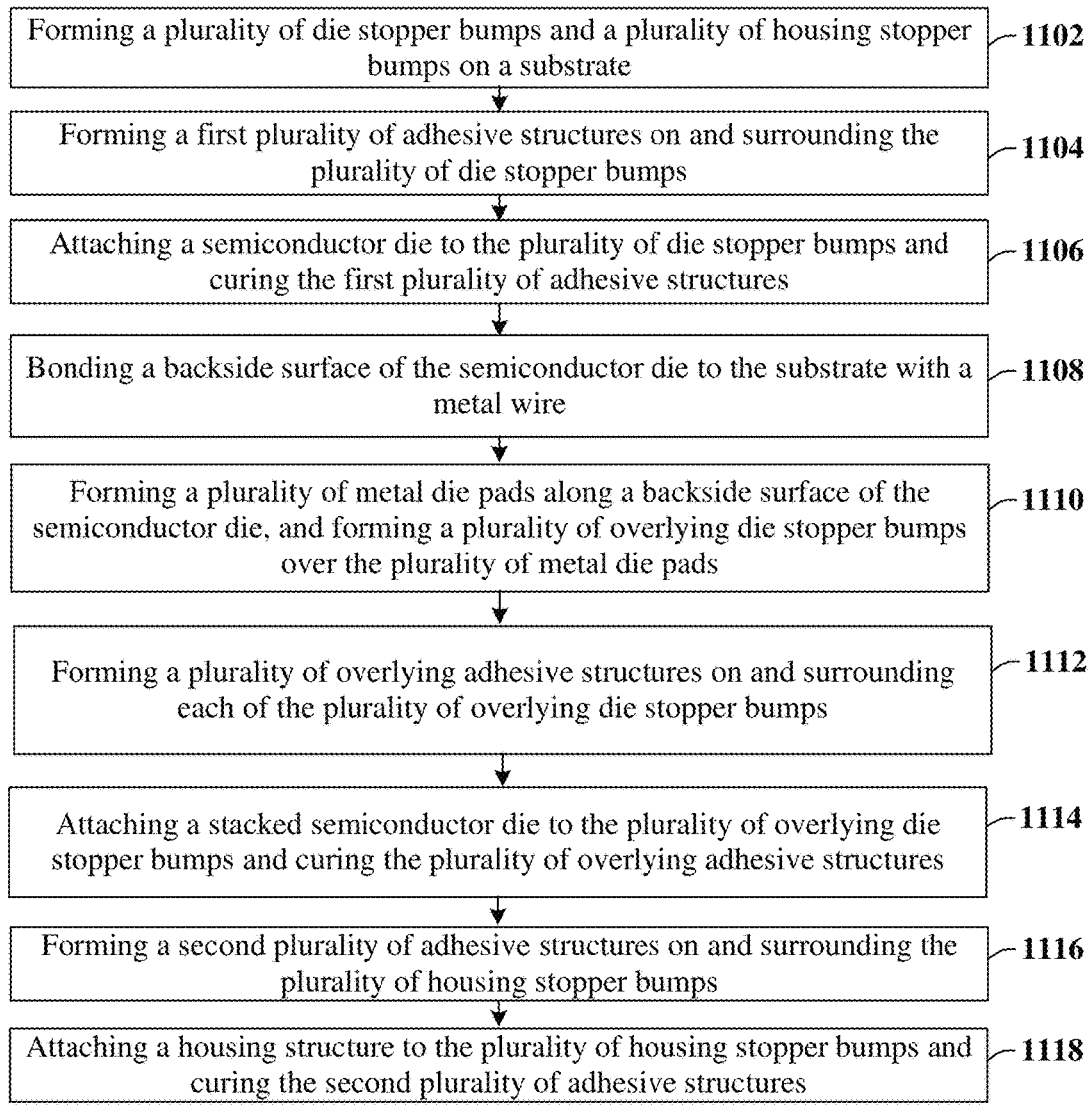
FIG. 11J illustrates a flowchart of some embodiments of the method consistent with FIGS. 11A-11I.

With respect to FIG. 11J, a flowchart 1100J of some embodiments of a method for forming an IC comprising a stopper bump structure separating stacked ICs. The IC may, for example, correspond to the IC of FIGS. 11A-11I.

While flowchart 1100J is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1102, a plurality of die stopper bumps and a plurality of housing stopper bumps are formed on a substrate. See, for example, FIG. 11A.

At 1104, a first plurality of adhesive structures is formed on and surrounds the plurality of die stopper bumps. See, for example, FIG. 11B.

At 1106, a semiconductor die is attached to the plurality of die stopper bumps, and the first plurality of adhesive structures is cured. See, for example, FIG. 11C.

At 1108, a frontside surface of the semiconductor die is bonded to the substrate with a metal wire. See, for example, FIG. 11D.

At 1110, a plurality of metal die pads is formed along a frontside surface of the semiconductor die, and a plurality of overlying die stopper bumps is formed over the plurality of metal die pads. See, for example, FIG. 11E.

At 1112, a plurality of overlying adhesive structures is formed on and surrounds each of the plurality of overlying die stopper bumps. See, for example, FIG. 11F.

At 1114, a stacked semiconductor die is attached to the plurality of overlying die stopper bumps and the plurality of overlying adhesive structures is cured. See, for example, FIG. 11G.

At 1116, a second plurality of adhesive structures is formed on and surrounds the plurality of housing stopper bumps. See, for example, FIG. 11H.

At 1118, a housing structure is attached to the plurality of housing stopper bumps, and the second plurality of adhesive structures is cured. See, for example, FIG. 11I.

With reference to FIGS. 12A-12F, a series of cross sections 1200A-1200F illustrate some embodiments of a method for forming an IC comprising a stopper bump structure used to control an angle of a semiconductor die. The IC may, for example, correspond to the IC of FIG. 4. Although FIGS. 12A-12F are described in relation to a method, it will be appreciated that the structures disclosed in FIGS. 12A-12F are not limited to such a method, but instead may stand alone as structures independent of the method.

Figure 12A:
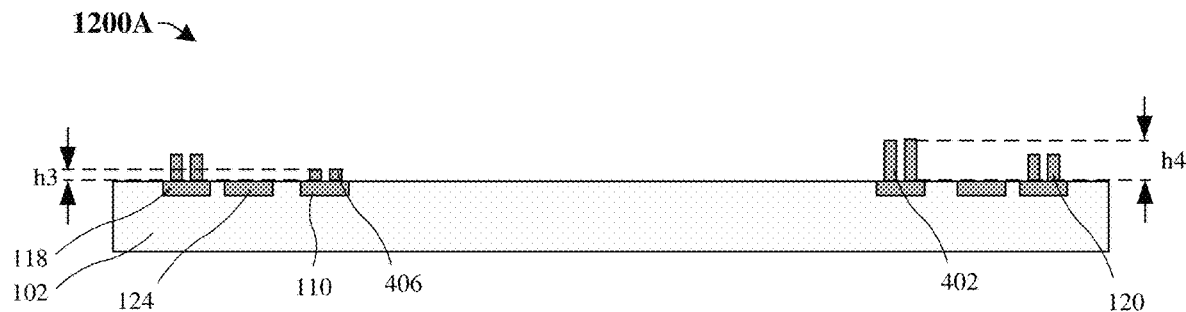
FIGS. 12A-12F illustrate a series of cross-sectional views for a method of forming an IC comprising a stopper bump structure used to control an angle of a semiconductor die.

As illustrated by the cross-sectional view 1200A of FIG. 12A, a first plurality of metal pads 110 are formed along a top surface of a provided substrate 102 by the bond pad formation process. In some embodiments, sidewalls of each of the plurality of metal pads 110 contact inner sidewalls of the substrate 102. A first plurality of die stopper bumps 406 are formed on a first end of the top surface of the substrate 102 by the stopper bump formation process. The first plurality of die stopper bumps 406 directly contacts the first plurality of metal pads 110. The first plurality of die stopper bumps 406 have a height h3. A second plurality of die stopper bumps 402 are formed on a second end of the substrate 102 opposite the first end by the stopper bump formation process. A third plurality of metal pads 118 and a fourth plurality of metal pads 124 are formed over the substrate 102 by the bond pad formation process. A plurality of die stopper bumps 106 is formed over the first plurality of metal pads 110 by the stopper bump formation process. A plurality of housing stopper bumps 120 is formed over the third plurality of metal pads 118 by the stopper bump formation process. The second plurality of die stopper bumps 402 directly contacts the first plurality of metal pads 110. The second plurality of die stopper bumps 402 have a height h4. In some embodiments, h4 is larger than h3. In some embodiments, the plurality of housing stopper bumps 120 may each have heights such that their top surfaces define a plane that is tilted relative to the top surface of the substrate 102.

Figure 12B:
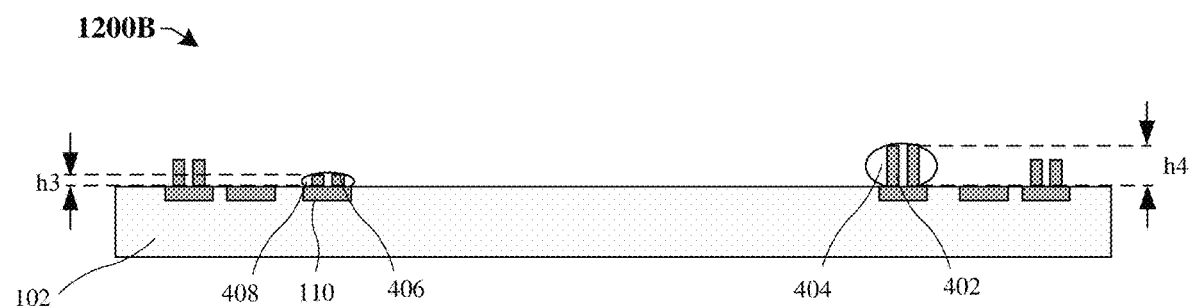

As illustrated by the cross-sectional view 1200B of FIG. 12B, a first plurality of die adhesive structures 408 is formed, surrounding each of the first plurality of die stopper bumps 406 such that the first plurality of die adhesive structures 408 has an approximate height equal to h3. A second plurality of die adhesive structures 404 is formed, surrounding each of the second plurality of die stopper bumps 402 such that the second plurality of die adhesive structures 404 has an approximate height equal to h4. For instance, the first plurality of die adhesive structures 408 and the second plurality of die adhesive structures 404 may be formed by pumping, squeezing, or otherwise providing a liquid around the first plurality of die stopper bumps 406 and the second plurality of die stopper bumps 402, respectively, and onto the plurality of metal pads 110.

Figure 12C:
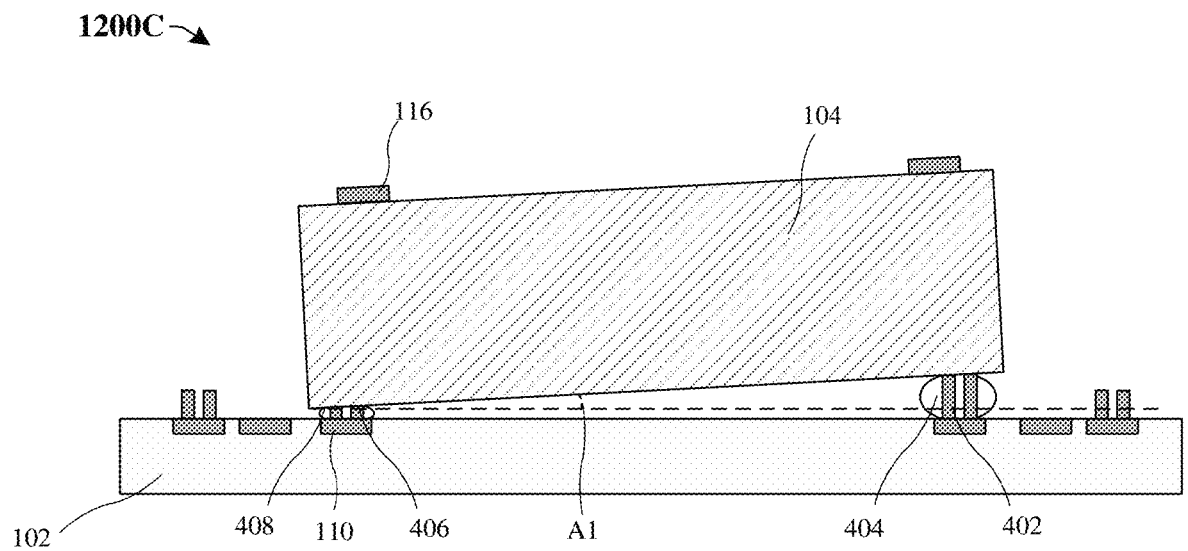

As illustrated by the cross-sectional view 1200C of FIG. 12C, a semiconductor die 104 is provided. The semiconductor die 104 includes a second plurality of metal pads 116 along a frontside surface of the semiconductor die 104. A backside surface of the semiconductor die 104 is then attached to the first plurality of die stopper bumps 406 and the second plurality of die stopper bumps 402, such that the semiconductor die 104 has a tilt angle A1 with respect to a top surface of the substrate 102. After the semiconductor die 104 is attached, the first plurality of die adhesive structures 408 and the second plurality of die adhesive structures 404 are cured.

Figure 12D:
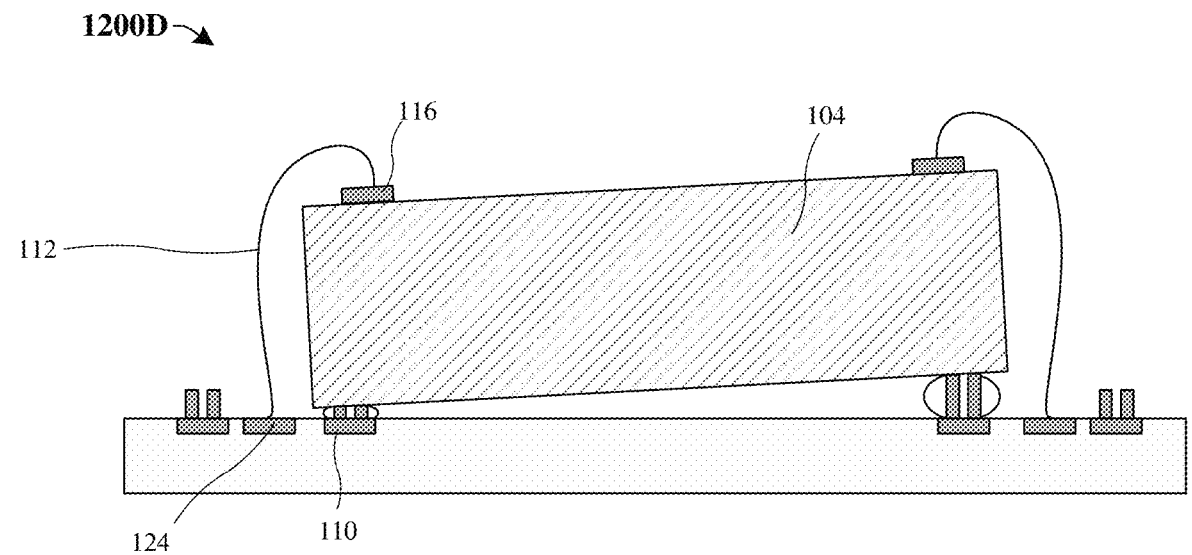

As illustrated by the cross-sectional view 1200D of FIG. 12D, metal wires 112 are formed, connecting the second plurality of metal pads 116 to the fourth plurality of metal pads 124, different than the metal pads underlying the first plurality of die stopper bumps 406 and the second plurality of die stopper bumps 402. In some embodiments, the metal wires 112 are connected to metal pads of the first plurality of metal pads 110 that are different than the metal pads underlying the plurality of die stopper bumps 106.

Figure 12E:
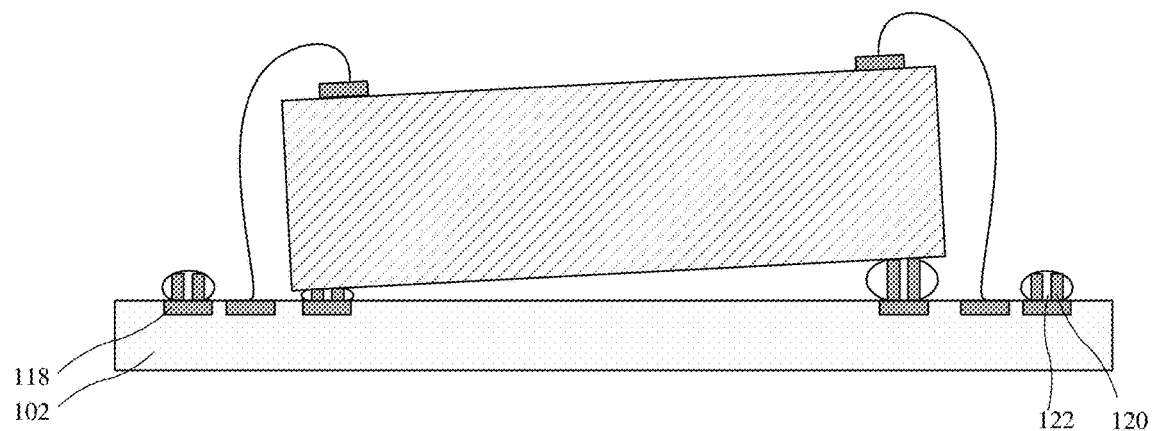

As illustrated by the cross-sectional view 1200E of FIG. 12E, a second plurality of adhesive structures 122 is formed over the third plurality of metal pads 118 such that the adhesive structures 122 surround each of the plurality of housing stopper bumps 120.

Figure 12F:
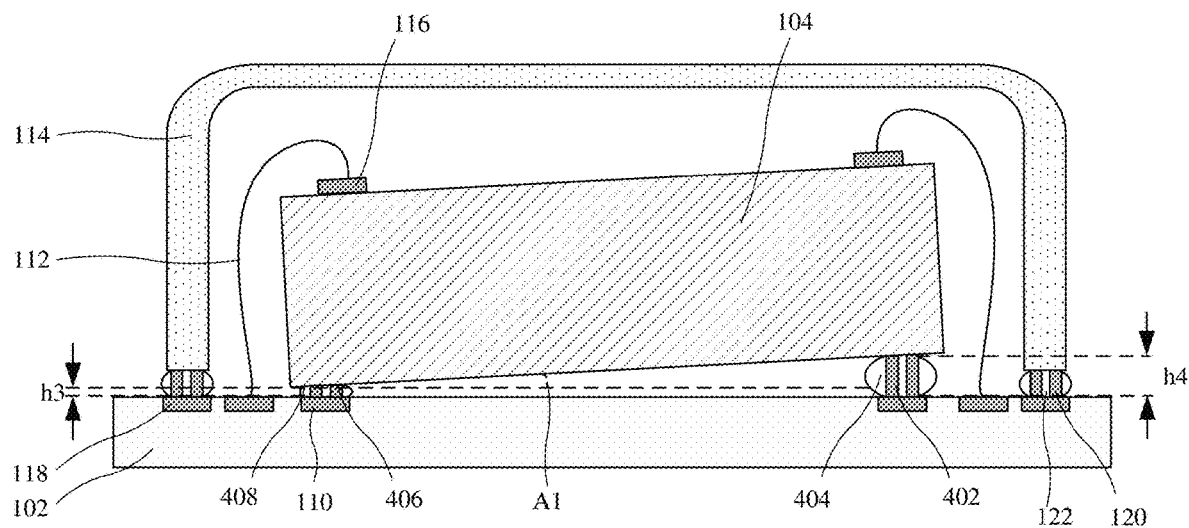

As illustrated by the cross-sectional view 1200F of FIG. 12F, a housing structure is provided. The housing structure 114 is then attached to the plurality of housing stopper bumps 120 such that the housing structure 114 overlies the semiconductor die 104. After the housing structure 114 is attached, the second plurality of adhesive structures 122 is cured.

Figure 12G:
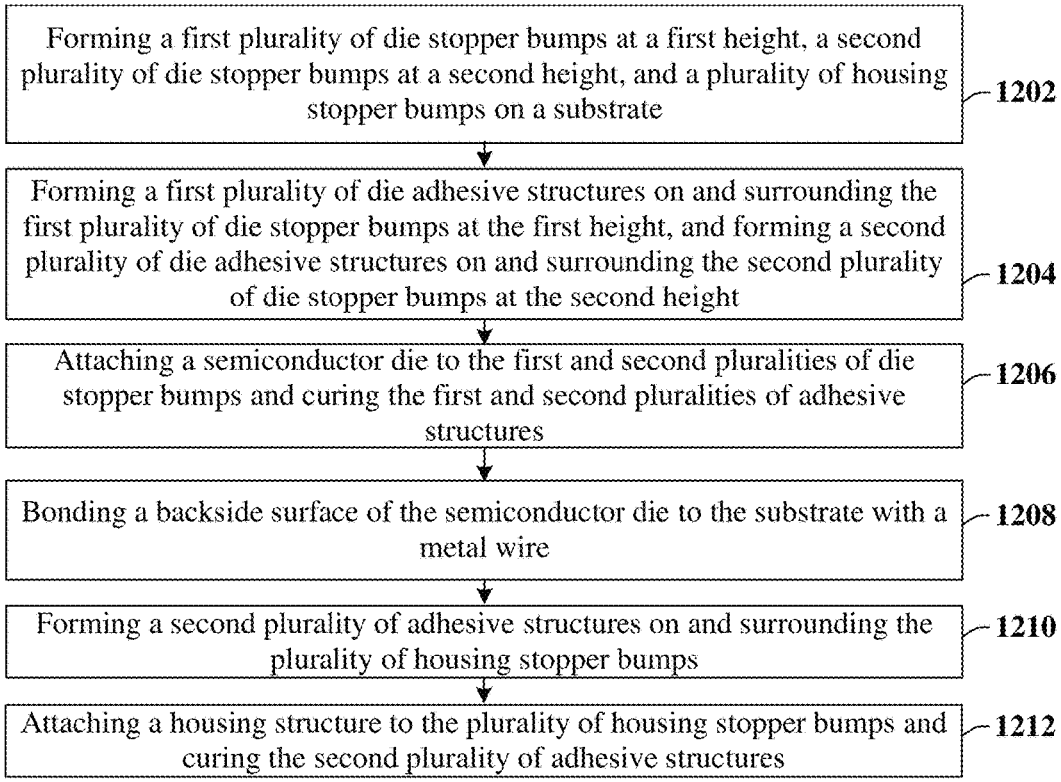
FIG. 12G illustrates a flowchart of some embodiments of the method consistent with FIGS. 12A-12F.

With respect to FIG. 12G, a flowchart 1200G of some embodiments of a method for forming an IC comprising a stopper bump structure used to control an angle of a semiconductor die. The IC may, for example, correspond to the IC of FIGS. 12A-12F.

While flowchart 1200G is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1202, a first plurality of die stopper bumps is formed on a substrate at a first height, a second plurality of die stopper bumps is formed on the substrate at a second height, and a plurality of housing stopper bumps is formed on the substrate. See, for example, FIG. 12A.

At 1204, a first plurality of die adhesive structures is formed on and surrounds the first plurality of die stopper bumps at the first height, and a second plurality of die adhesive structures is formed on and surrounds the second plurality of die stopper bumps at the second height. See, for example, FIG. 12B.

At 1206, a semiconductor die is attached to the first and second pluralities of die stopper bumps, and the first and second pluralities of adhesive structures are cured. See, for example, FIG. 12C.

At 1208, a frontside surface of the semiconductor die is bonded to the substrate with a metal wire. See, for example, FIG. 12D.

At 1210, a second plurality of adhesive structures is formed on and surrounds the plurality of housing stopper bumps. See, for example, FIG. 12E.

At 1212, a housing structure is attached to the plurality of housing stopper bumps, and the second plurality of adhesive structures is cured. See, for example, FIG. 12F.

With reference to FIGS. 13A-13E, a series of cross sections 1300A-1300E illustrate some embodiments of a method for forming an IC comprising an electrically conductive stopper bump structure. The IC may, for example, correspond to the IC of FIG. 5. Although FIGS. 13A-13E are described in relation to a method, it will be appreciated that the structures disclosed in FIGS. 13A-13E are not limited to such a method, but instead may stand alone as structures independent of the method.

Figure 13A:
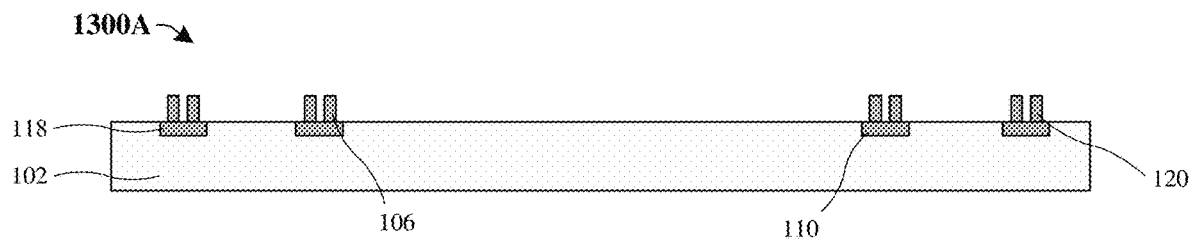
FIGS. 13A-13E illustrate a series of cross-sectional views for a method of forming an IC comprising an electrically conductive stopper bump structure.

As illustrated by the cross-sectional view 1300A of FIG. 13A, a substrate 102 is provided. A first plurality of metal pads 110 and a third plurality of metal pads 118 are formed on a top surface of the substrate 102. A plurality of die stopper bumps 106 is formed on a top surface of the first plurality of metal pads 110 by the stopper bump formation process. A plurality of housing stopper bumps 120 is formed on a top surface of the third plurality of metal pads 118 by the stopper bump formation process.

Figure 13B:
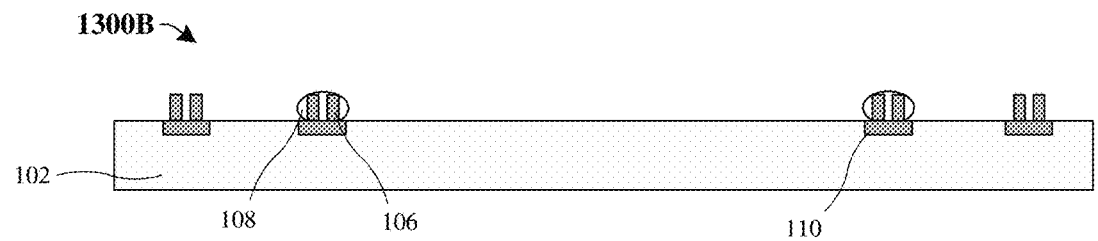

As illustrated by the cross-sectional view 1300B of FIG. 13B, a first plurality of adhesive structures 108 is formed, surrounding each of the plurality of die stopper bumps 106.

Figure 13C:
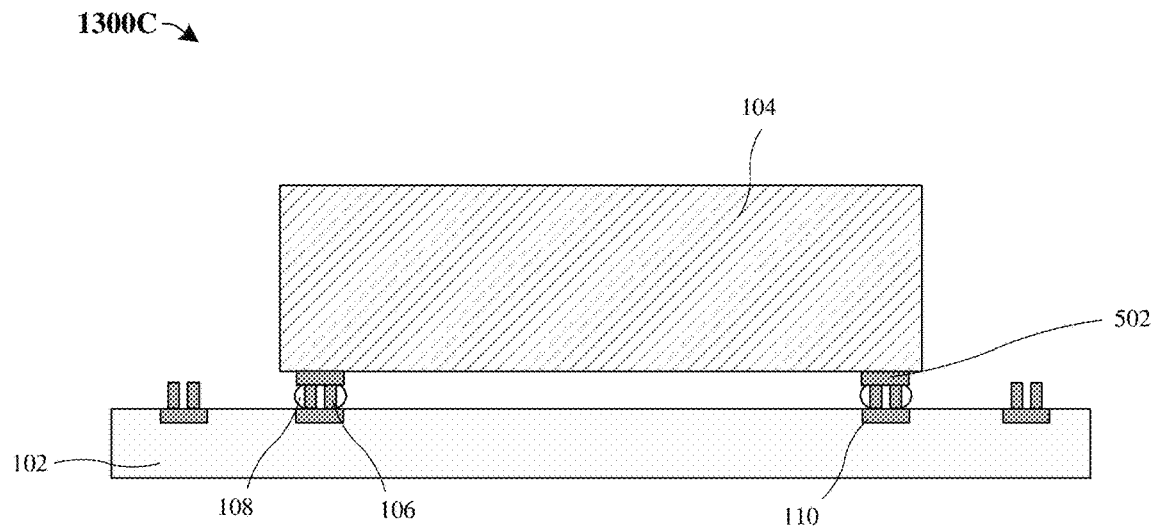

As illustrated by the cross-sectional view 1300C of FIG. 13C, a semiconductor die 104 is provided. A plurality of metal die pads 502 are formed along a frontside surface of the semiconductor die 104 by the bond pad formation process, such that a first surface of the plurality of metal die pads 502 contacts the semiconductor die 104. A second surface of the plurality of metal die pads 502 opposite that of the first surface is then attached to the plurality of die stopper bumps 106 to establish an electrical connection between the first plurality of metal pads 110 and the plurality of metal die pads 502. After the semiconductor die 104 is attached, the first plurality of adhesive structures 108 is cured.

Figure 13D:
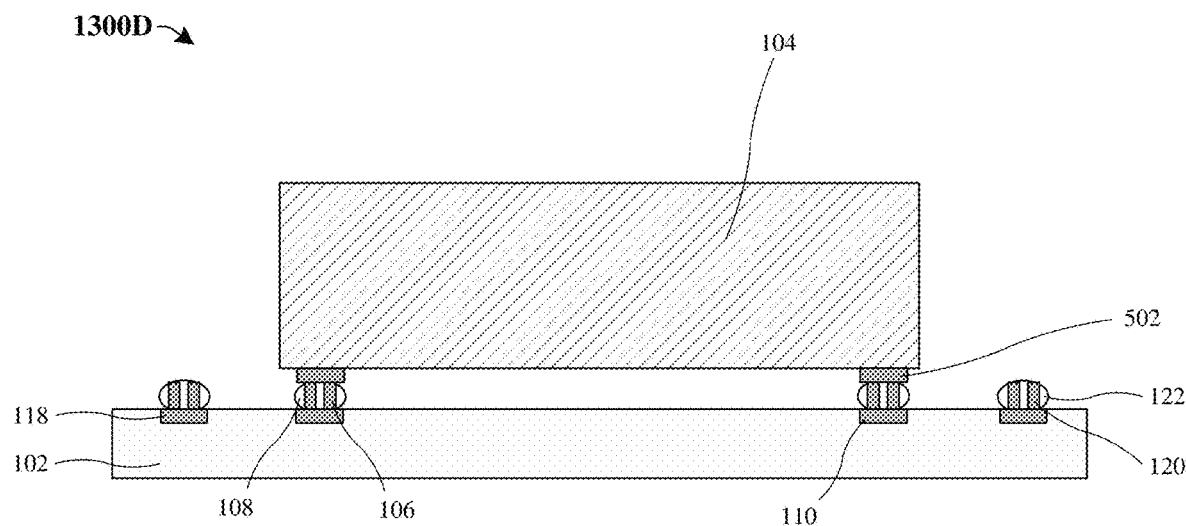

As illustrated by the cross-sectional view 1300D of FIG. 13D, a second plurality of adhesive structures 122 is formed over the third plurality of metal pads 118 such that the adhesive structures 122 surround each of the plurality of housing stopper bumps 120.

Figure 13E:
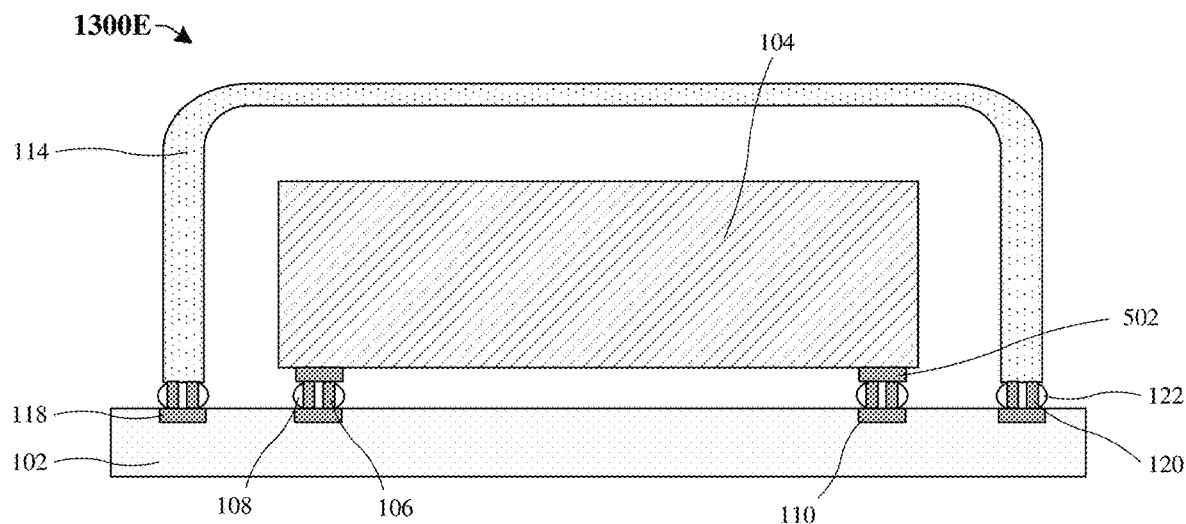

As illustrated by the cross-sectional view 1300E of FIG. 13E, a housing structure is provided. The housing structure 114 is then attached to the plurality of housing stopper bumps 120 such that the housing structure 114 overlies the stacked semiconductor die 304. After the housing structure 114 is attached, the second plurality of adhesive structures 122 is cured.

Figure 13F:
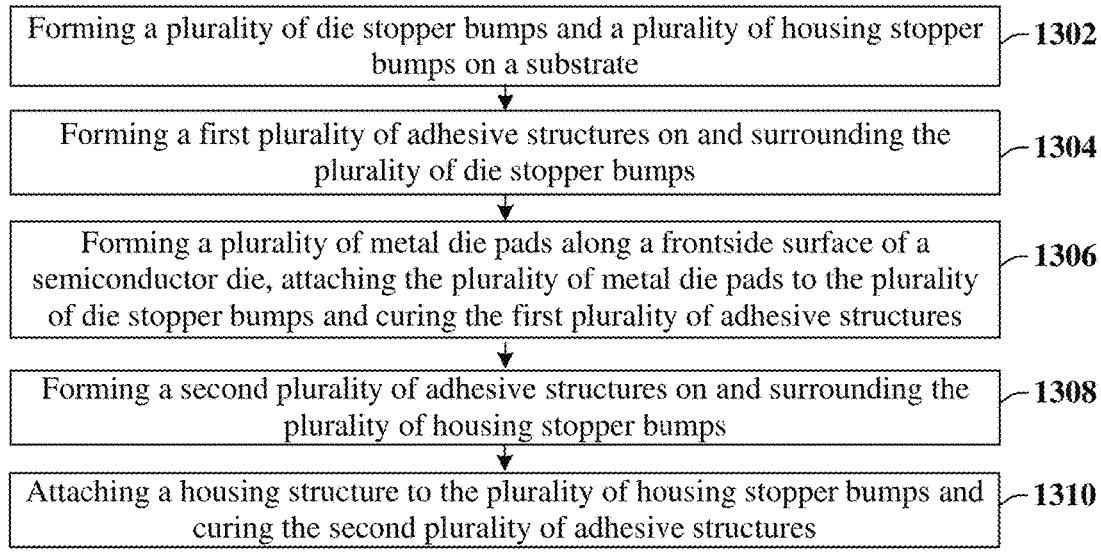
FIG. 13F illustrates a flowchart of some embodiments of the method consistent with FIGS. 13A-13E.

With respect to FIG. 13F, a flowchart 1300F of some embodiments of a method for forming an IC comprising an electrically conductive stopper bump structure. The IC may, for example, correspond to the IC of FIGS. 13A-13E.

While flowchart 1300F is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1302, a plurality of die stopper bumps and a plurality of housing stopper bumps are formed on a substrate. See, for example, FIG. 13A.

At 1304, a first plurality of adhesive structures is formed on and surrounds the plurality of die stopper bumps. See, for example, FIG. 13B.

At 1306, a plurality of metal die pads is formed along a frontside surface of a semiconductor die, the plurality of metal die pads is attached to the plurality of die stopper bumps, and the first plurality of adhesive structures is cured. See, for example, FIG. 13C.

At 1308, a second plurality of adhesive structures is formed on and surrounds the plurality of housing stopper bumps. See, for example, FIG. 13D.

At 1310, a housing structure is attached to the plurality of housing stopper bumps, and the second plurality of adhesive structures is cured. See, for example, FIG. 13E.

Figure 14:
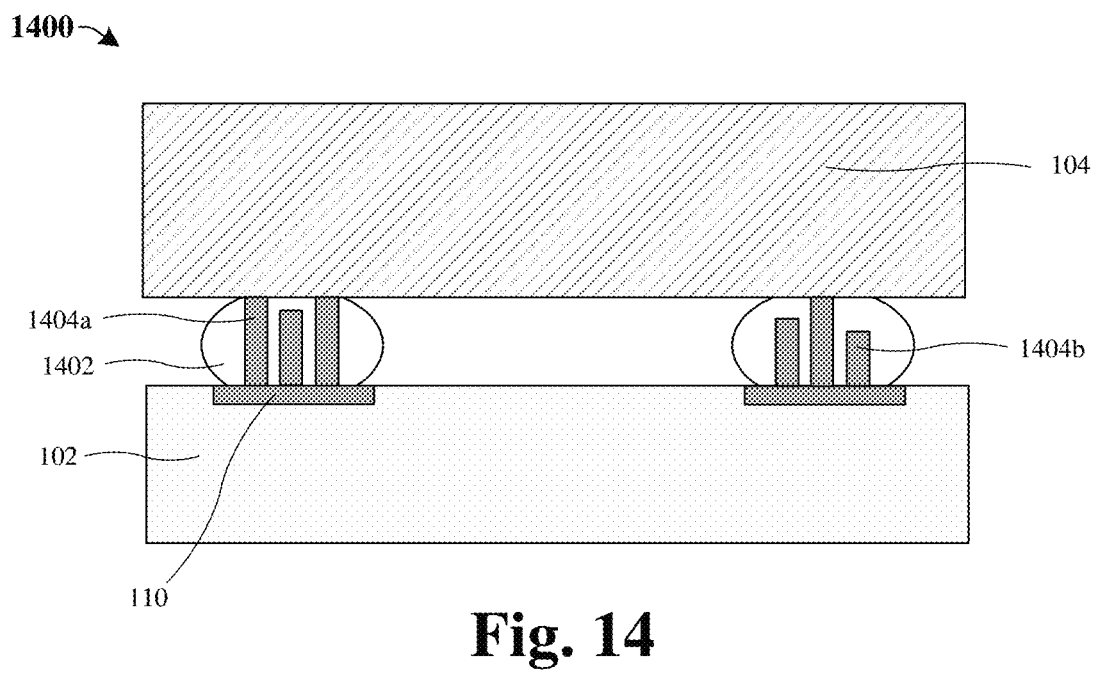
FIG. 14 illustrates a cross-sectional view of some embodiments of an IC comprising a stopper bump structure with differing heights.

FIG. 14 illustrates a cross-sectional view 1400 of some embodiments of an IC comprising a stopper bump structure. The IC may be, for example, the IC of FIG. 1. The IC comprises a first plurality of metal pads 110 overlying a substrate 102. A first plurality of stopper bumps 1404a overlies one of the first plurality of metal pads 110 and separates the substrate 102 from an overlying semiconductor die 104. A first plurality of stopper bumps 1404a overlies one of the first plurality of metal pads 110 and further separates the substrate 102 from the overlying semiconductor die 104. In some embodiments, each stopper bump of the first and second pluralities of stopper bumps 1404a and 1404b may have a different height, as a formation process of the first and second pluralities of stopper bumps 1404a and 1404b may have a standard deviation in height. In some embodiments, the standard deviation may range from 3 um to 5 um. In some embodiments, a stopper bump of the first plurality of stopper bumps 1404a with a greatest height directly contacts the semiconductor die 104 and a stopper bump of the second plurality of stopper bumps 1404b with a greatest height directly contacts the semiconductor die 104, such that the stopper bump with the greatest height of the first plurality of stopper bumps 1404a and the stopper bump with the greatest height of the second plurality of stopper bumps 1404b determine a distance of the semiconductor die 104 from the substrate 102.

Accordingly, in some embodiments, the present disclosure relates to an integrated chip (IC), comprising a substrate, a first die disposed over the substrate, a metal wire attached to a frontside of the first die, and a first plurality of die stopper bumps disposed along a backside of the first die and configured to control an angle of operation of the first die. The first plurality of die stopper bumps directly contacts a backside surface of the first die.

In other embodiments, the present disclosure relates to a method for forming an integrated chip (IC), comprising forming a first stopper structure on a substrate, forming a first adhesive structure on and surrounding the first stopper structure, attaching a first die to the first adhesive structure and curing the first adhesive structure, and bonding a bottom surface of the first die to the substrate with a metal wire.

In yet other embodiments, the present disclosure relates to an integrated chip (IC), comprising a substrate including a plurality of metal pads on a top surface of the substrate, a die disposed over the substrate, and the die including a first side over the top surface of the substrate and a second side over the first side, a housing structure disposed over the second side of the die and surrounding sidewalls of the die, a plurality of stopper bumps disposed between the first side of the die and a first metal pad of the plurality of metal pads, and a plurality of adhesive structures disposed on and surrounding each of the plurality of stopper bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
   a substrate;
   a die disposed vertically over the substrate;
   a housing structure disposed over the substrate and the die;
   a metal pad disposed over the substrate and coupled to an underside of the housing structure, wherein the metal pad has an outer sidewall that extends horizontally past an outer sidewall of the die;
   an adhesive coupling the die to the metal pad; and
   stopper bumps laterally surrounded by the adhesive, the stopper bumps contacting the die and the metal pad.

2. The IC of claim 1, further comprising:
   a metal wire extending between the substrate and a frontside of the first die.

3. The IC of claim 1,
   wherein the housing structure surrounds sidewalls of the die.

4. The IC of claim 3, further comprising:
   housing stopper bumps directly contacting and disposed between the housing structure and the substrate.

5. The IC of claim 4, wherein the housing stopper bumps and the stopper bumps comprise the same material as one another.

6. The IC of claim 3, further comprising:
   a cavity arranged directly between the housing structure and an uppermost surface of the die and separating the housing structure from the uppermost surface of the die.

7. The IC of claim 1, further comprising:
   a metal wire extending from the metal pad to a first side of the die, wherein the first side of the die faces the substrate.

8. An integrated chip (IC), comprising:
   a substrate;
   a die disposed over the substrate;
   a housing structure disposed over the die and surrounding sidewalls of the die; and
   a plurality of die stopper bumps arranged as a plurality of groups of die stopper bumps, wherein each group of the plurality of groups of die stopper bumps is disposed between an upper surface of the die and a lower surface of the housing structure, wherein the plurality of die stopper bumps suspend the die from the housing structure over the substrate.

9. The IC of claim 8, further comprising:
   a plurality of metal pads disposed along a lateral portion of an inner surface of the housing structure, and
   a metal wire extending from a metal pad of the plurality of metal pads to the die.

10. The IC of claim 8, further comprising:
a first plurality of adhesive structures, wherein each of the first plurality of adhesive structures is disposed on and surrounds a corresponding group of the plurality of groups of die stopper bumps.

11. The IC of claim 8, wherein the plurality of die stopper bumps are surrounded by an adhesive.

12. The IC of claim 11, further comprising:
a plurality of metal pads disposed along a lateral portion of an inner surface of the housing structure, and
a metal wire extending from a metal pad of the plurality of metal pads to the die.

13. The IC of claim 12, wherein each die stopper bump of a group of die stopper bumps and the metal wire contact the metal pad.

14. An integrated chip (IC), comprising:
a substrate having an upper surface and a lower surface;
a dome-like housing structure disposed over the substrate, wherein an interior surface of the dome-like housing structure and the upper surface of the substrate define a cavity; and
a die coupled to the interior surface of the dome-like housing structure and thereby suspended over an upper surface of the substrate, the die having a lower surface proximate to the substrate and an upper surface over the lower surface of the die;
an adhesion structure sandwiched between the upper surface of the die and the interior surface of the dome-like housing structure, the adhesion structure having a volume defined by an outer sidewall of the adhesion structure; and
multiple die stopper bumps each enveloped by the adhesion structure, the multiple die stopper bumps each having a lower surface contacting the upper surface of the die and each having an upper surface contacting the interior surface of the dome-like housing structure.

15. The IC of claim 14, further comprising:
a plurality of housing stopper bumps directly contacting and disposed between a bottom surface of the dome-like housing structure and the upper surface of the substrate.

16. The IC of claim 14, wherein each of the multiple die stopper bumps comprises a solder ball bump.

17. The IC of claim 14, wherein each of the multiple die stopper bumps comprises a stud bump, wherein the stud bump comprises a lower portion and an upper portion, wherein the lower portion has a maximum width greater than that of the upper portion, and wherein the lower portion comprises sidewalls laterally offset from sidewalls of the upper portion.

18. The IC of claim 14, wherein the multiple die stopper bumps are separated into at least one group of die stopper bumps, wherein each group of die stopper bumps comprises at least one row of die stopper bumps and at least one column of die stopper bumps.

19. The IC of claim 18, wherein the adhesive structure is a single body that surrounds an outer perimeter of the group of die stopper bumps and that resides between die stopper bumps of the group of die stopper bumps to adhere the die stopper bumps of the group of die stopper bumps to one another.

20. The IC of claim 14, further comprising:
a metal wire extending between a first contact or bond pad on the lower surface of the die and a second contact or bond pad on the interior surface of the dome-like housing structure.

* * * * *